US012635137B2

(12) United States Patent
Wu et al.

(10) Patent No.: US 12,635,137 B2
(45) Date of Patent: May 19, 2026

(54) THREE-DIMENSIONAL MEMORY AND FABRICATION METHOD THEREOF

(71) Applicant: YANGTZE MEMORY TECHNOLOGIES CO., LTD., Wuhan (CN)

(72) Inventors: Linchun Wu, Wuhan (CN); Kun Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 752 days.

(21) Appl. No.: 18/089,559

(22) Filed: Dec. 27, 2022

(65) Prior Publication Data

US 2023/0138251 A1     May 4, 2023

Related U.S. Application Data

(63) Continuation of application No. PCT/CN2021/127916, filed on Nov. 1, 2021.

(51) Int. Cl.
*H10B 43/35*          (2023.01)
*H10B 43/27*          (2023.01)
*H10B 43/50*          (2023.01)

(52) U.S. Cl.
CPC ............. *H10B 43/35* (2023.02); *H10B 43/27* (2023.02); *H10B 43/50* (2023.02)

(58) Field of Classification Search
CPC ......... H10B 43/35; H10B 43/27; H10B 43/50
See application file for complete search history.

(56) References Cited

U.S. PATENT DOCUMENTS

| | | | | |
|---|---|---|---|---|
| 2018/0006052 A1* | 1/2018 | Hwang | ............. | H01L 21/76879 |
| 2021/0320121 A1* | 10/2021 | Wu | ......................... | H10B 43/27 |
| 2022/0231038 A1* | 7/2022 | Baek | ...................... | H10B 41/27 |
| 2023/0132530 A1* | 5/2023 | Wu | ...................... | H10D 64/017 |
| | | | | 438/273 |
| 2024/0074181 A1* | 2/2024 | Wu | ......................... | H10B 43/50 |

FOREIGN PATENT DOCUMENTS

| | | |
|---|---|---|
| CN | 112614848 A | 4/2021 |
| CN | 112768467 A | 5/2021 |

* cited by examiner

*Primary Examiner* — Thanh T Nguyen
(74) *Attorney, Agent, or Firm* — BAYES PLLC

(57)          ABSTRACT

A method for fabricating a three-dimensional memory includes forming a first stack substrate on a substrate. The method also includes forming bottom select gate cuts through the first stack structure, and forming first sacrificial layers within the bottom select gate cuts. The method further includes forming a second stack structure covering the first sacrificial layers and the first stack structure. Both the first stack structure and the second stack structure include alternately stacked dielectric layers and gate sacrificial layers. The method further includes replacing the first sacrificial layers with first conductive layers, and replacing the gate sacrificial layers with gate conductive layers. The method further includes forming trenches exposing the first conductive layers on the side of the first stack structure far away from the second stack structure. The method further includes replacing the first conductive layers with insulating layers via the trenches.

14 Claims, 20 Drawing Sheets

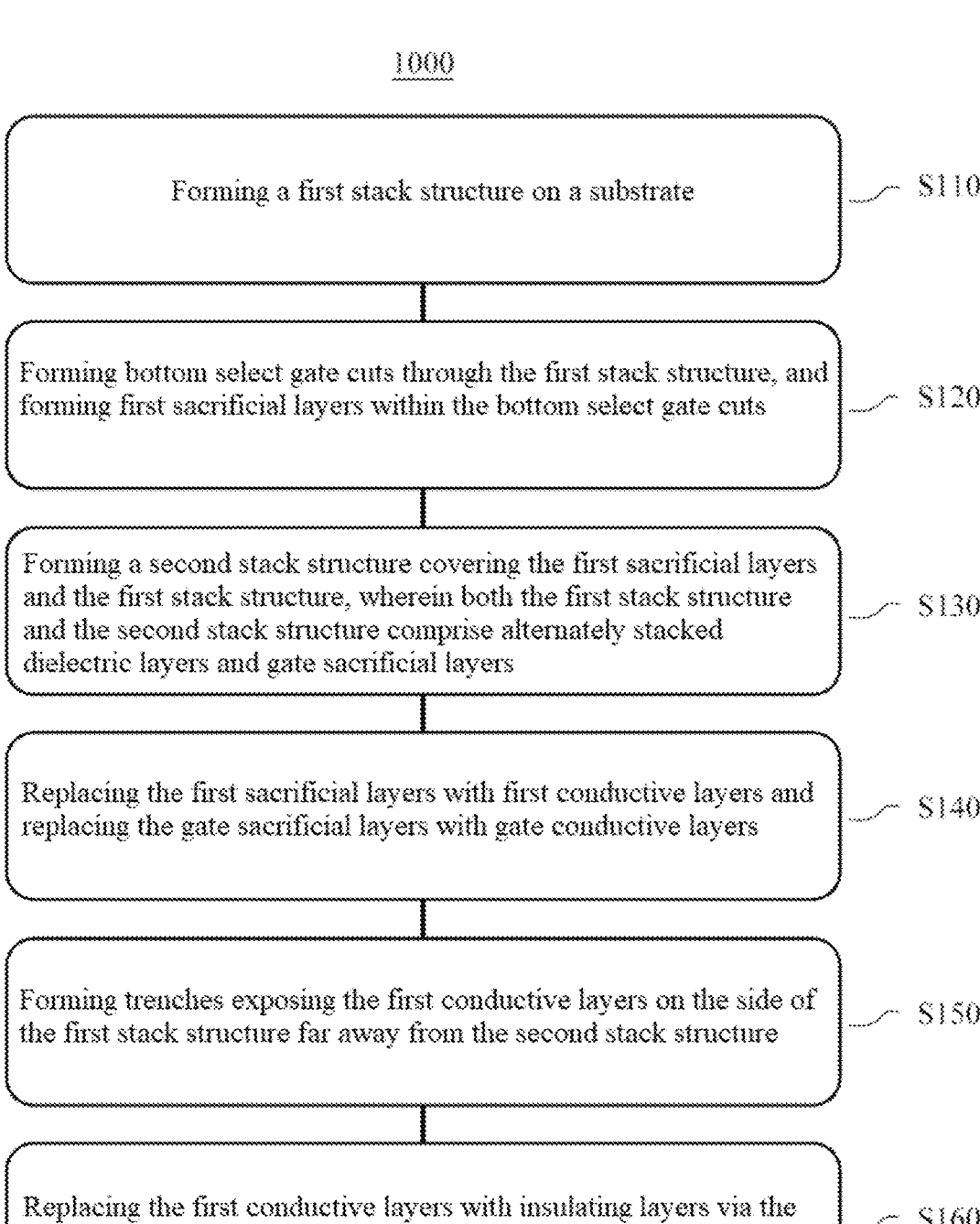

1000

Forming a first stack structure on a substrate    S110

Forming bottom select gate cuts through the first stack structure, and forming first sacrificial layers within the bottom select gate cuts    S120

Forming a second stack structure covering the first sacrificial layers and the first stack structure, wherein both the first stack structure and the second stack structure comprise alternately stacked dielectric layers and gate sacrificial layers    S130

Replacing the first sacrificial layers with first conductive layers and replacing the gate sacrificial layers with gate conductive layers    S140

Forming trenches exposing the first conductive layers on the side of the first stack structure far away from the second stack structure    S150

Replacing the first conductive layers with insulating layers via the trenches    S160

FIG. 1

THREE-DIMENSIONAL MEMORY AND FABRICATION METHOD THEREOF

CROSS-REFERENCE TO RELATED APPLICATIONS

This application is a continuation of International Application No. PCT/CN2021/127916, filed on Nov. 1, 2021, which is incorporated herein by reference in its entirety.

TECHNICAL FIELD

The present disclosure relates to the technical field of semiconductors, and more particularly, to a three-dimensional memory and a fabrication method thereof.

BACKGROUND

To increase the storage capacity per unit area, a three-dimensional memory developed in a longitudinal direction emerges as the times require. The three-dimensional memory generally comprises channel structures formed in stack structures, and conductive layers in the stack structures and portions of the channel structures corresponding to the conductive layers jointly form memory cells, and the conductive layers serve as gates of the memory cells. A plurality of memory cells arranged along the extending direction of the channel structures constitute a memory cell string, and a plurality of memory cell strings form a two-dimensional array (referred to as a memory cell array) on a plane parallel to a substrate. Gate slits are used to divide the memory cell array into memory blocks, and bottom select gate cuts further divide the memory blocks for separating the conductive layers used to control bottom select transistors at the ends of the memory cell strings, so as to reduce electrical influence between, for example, the adjacent memory cell strings when applying a voltage to the bottom select transistors through the conductive layers.

In some practical applications, the conductive layers in the stack structure are generally formed using a process called "gate replacement," while it is difficult to perform the process of "gate replacement" between two bottom select gate cuts in the case that the adjacent gate slits include a plurality of bottom select gate cuts therebetween.

SUMMARY

The present disclosure provides a fabrication method of a three-dimensional memory. The fabrication method comprises: forming a first stack structure on a substrate; forming bottom select gate cuts through the first stack structure, and forming first sacrificial layers within the bottom select gate cuts; forming a second stack structure covering the first sacrificial layers and the first stack structure, wherein both the first stack structure and the second stack structure comprise alternately stacked dielectric layers and gate sacrificial layers; replacing the first sacrificial layers with first conductive layers and replacing the gate sacrificial layers with gate conductive layers; forming trenches exposing the first conductive layers on the side of the first stack structure far away from the second stack structure; and replacing the first conductive layers with insulating layers via the trenches.

In some implementations, the step of replacing the first sacrificial layers with the first conductive layers and replacing the gate sacrificial layers with the gate conductive layers may comprise: forming gate slits through the second stack structure and the first stack structure; and replacing the first sacrificial layers with the first conductive layers and replacing the gate sacrificial layers with the gate conductive layers via the gate slits.

In some implementations, a plurality of the gate slits extend along a first direction parallel to the substrate, and at least two of the bottom select gate cuts extending along the first direction may be located between adjacent ones of the gate slits.

In some implementations, the step of replacing the first sacrificial layers with the first conductive layers and replacing the gate sacrificial layers with the gate conductive layers via the gate slits may comprise: removing the first sacrificial layers and the gate sacrificial layers via the gate slits to form sacrificial gaps; and forming the first conductive layers within portions of the sacrificial gaps corresponding to the first sacrificial layers and forming the gate conductive layers within portions of the sacrificial gaps corresponding to the gate sacrificial layers.

In some implementations, materials of the gate sacrificial layers and the first sacrificial layers may be the same.

In some implementations, materials of the gate conductive layers and the first conductive layers may be the same.

In some implementations, the trenches may be at least partially aligned with the first conductive layers.

In some implementations, in a second direction parallel to the substrate and intersecting with the first direction, widths of the trenches may be greater than those of the first conductive layers.

In some implementations, the fabrication method may further comprise: forming channel structures through the second stack structure and the first stack structure, the channel structures comprising function layers and channel layers extending into the substrate.

In some implementations, before the step of forming the trenches exposing the first conductive layers on the side of the first stack structure far away from the second stack structure, the fabrication method may further comprise: removing the substrate and portions of the function layers extending into the substrate to expose portions of the channel layers; and forming a semiconductor layer in contact with the exposed portions of the channel layers, wherein the trenches run through portions of the semiconductor layer corresponding to the first conductive layers.

In some implementations, the fabrication method may further comprise: making portions of the channel layers of the channel structures extending into the substrate contact with the substrate, wherein the trenches run through portions of the substrate corresponding to the first conductive layers.

In some implementations, the step of replacing the first conductive layers with the insulating layers via the trenches may comprise: filling an insulating material within the trenches while replacing the first conductive layers with the insulating layers.

In some implementations, the step of replacing the first conductive layers with the insulating layers via the trenches may comprise: removing the first conductive layers via the trenches; removing a portion of the gate conductive layers in contact with the first conductive layers to form filling gaps; and forming the insulating layers within the filling gaps.

In some implementations, after the step of removing the portion of the gate conductive layers in contact with the first conductive layers to form the filling gaps, the fabrication method may further comprise: removing a portion of the gate conductive layers exposed to the filling gaps.

The present disclosure further provides a three-dimensional memory. The three-dimensional memory comprises:

an active layer; a stack structure comprising a first stack structure and a second stack structure that are located on the active layer in sequence; bottom select gate cut structures through the first stack structure; and trench structures running through the active layer and contacting with the bottom select gate cut structures.

In some implementations, the three-dimensional memory may further comprise gate slit structures, a plurality of the gate slit structures extending along a first direction of the active layer, and at least two of the bottom select gate cut structures extending parallel to the first direction being located between adjacent ones of the gate slit structures.

In some implementations, the three-dimensional memory may further comprise: channel structures through the second stack structure and the first stack structure, the channel structures comprising channel layers extending to the active layer and contacting with the active layer.

In some implementations, in a second direction parallel to the active layer and intersecting with the first direction, widths of the trench structures may be greater than those of the bottom select gate cut structures.

In some implementations, materials of the trench structures may comprise dielectric materials.

In some implementations, the trench structures may be at least partially aligned with the bottom select gate cut structures.

By first forming the first sacrificial layers within the bottom select gate cuts, and replacing the gate sacrificial layers between two bottom select gate cuts with the gate conductive layers via the gaps formed after removing the first sacrificial layers in the "gate replacement" process, the fabrication method of the three-dimensional memory provided by some implementations of the present disclosure is beneficial to improve process compatibility and feasibility in the case that there are a plurality of bottom select gate cuts between the adjacent gate slits.

BRIEF DESCRIPTION OF THE DRAWINGS

By reading the detailed description of non-limitative implementations made by reference to the following figures, other features, purposes, and advantages of the present disclosure will become more apparent:

FIG. 1 is a flowchart of a fabrication method of a three-dimensional memory according to an implementation of the present disclosure;

DETAILED DESCRIPTION

Figure 2A:
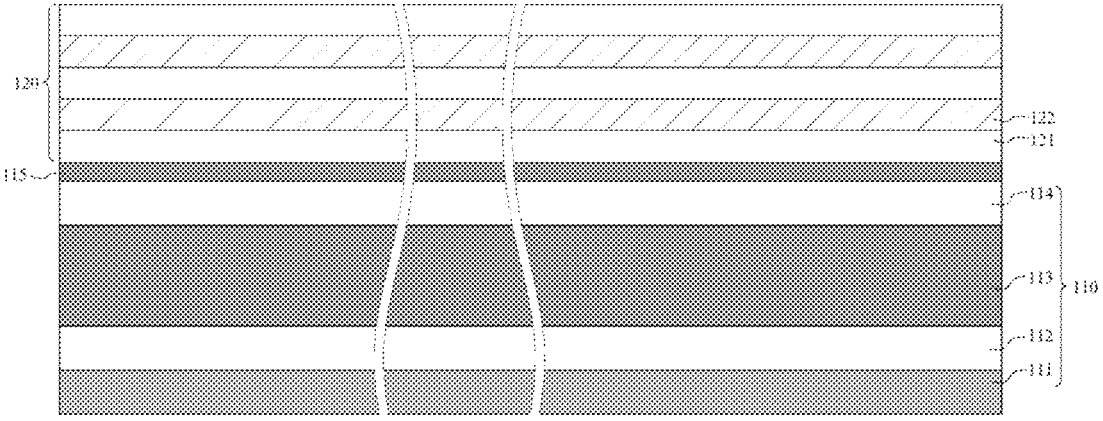
FIGS. 2A to 2O are schematic process sectional views of a fabrication method of a three-dimensional memory according to an implementation of the present disclosure.

For a better understanding of the present disclosure, various aspects of the present disclosure will be described in more detail with reference to the figures. It should be understood that, these detailed descriptions merely describe exemplary implementations of the present disclosure, instead of restricting the scope of the present disclosure in any manner.

The terms used herein are for the purpose of describing particular exemplary implementations, and are not intended to be restrictive. The terms "comprise," "comprising," "include," and/or "including," when used in this specification, represent the presence of stated features, integers, elements, components, and/or a combination thereof, but do not exclude one or more other features, integers, elements, components and/or a combination thereof.

This specification is described with reference to the schematic diagrams of exemplary implementations. The exemplary implementations disclosed herein should not be interpreted as being limited to the specific shape and size as shown, but include various equivalent structures capable of achieving the same functions and deviations of shapes and sizes generated, for example, during manufacturing. The locations shown in the figures are essentially illustrative, and are not intended to limit the locations of various components.

Unless otherwise defined, all terms (including technical terms and scientific terms) used herein have the same meanings as those generally understood by those of ordinary skill in the art to which the present disclosure pertains. The terms such as those defined in common dictionaries should be interpreted as having meanings that are consistent with their meanings in the context of the relevant art, and will not be interpreted in an idealized or overly formal sense unless explicitly defined as such herein.

The present disclosure provides a fabrication method 1000 of a three-dimensional memory. FIG. 1 is a flowchart of a fabrication method 1000 of a three-dimensional memory according to an implementation of the present disclosure. As shown in FIG. 1, the fabrication method 1000 of the three-dimensional memory comprises the following steps: S110: forming a first stack structure on a substrate; S120: forming bottom select gate cuts through the first stack structure, and forming first sacrificial layers within the bottom select gate cuts; S130: forming a second stack structure covering the first sacrificial layers and the first stack structure, wherein both the first stack structure and the second stack structure comprise alternately stacked dielectric layers and gate sacrificial layers; S140: replacing the first sacrificial layers with first conductive layers and replacing the gate sacrificial layers with gate conductive layers; S150: forming trenches exposing the first conductive layers on the side of the first stack structure far away from the second stack structure; and S160: replacing the first conductive layers with insulating layers via the trenches.

Figure 2O:
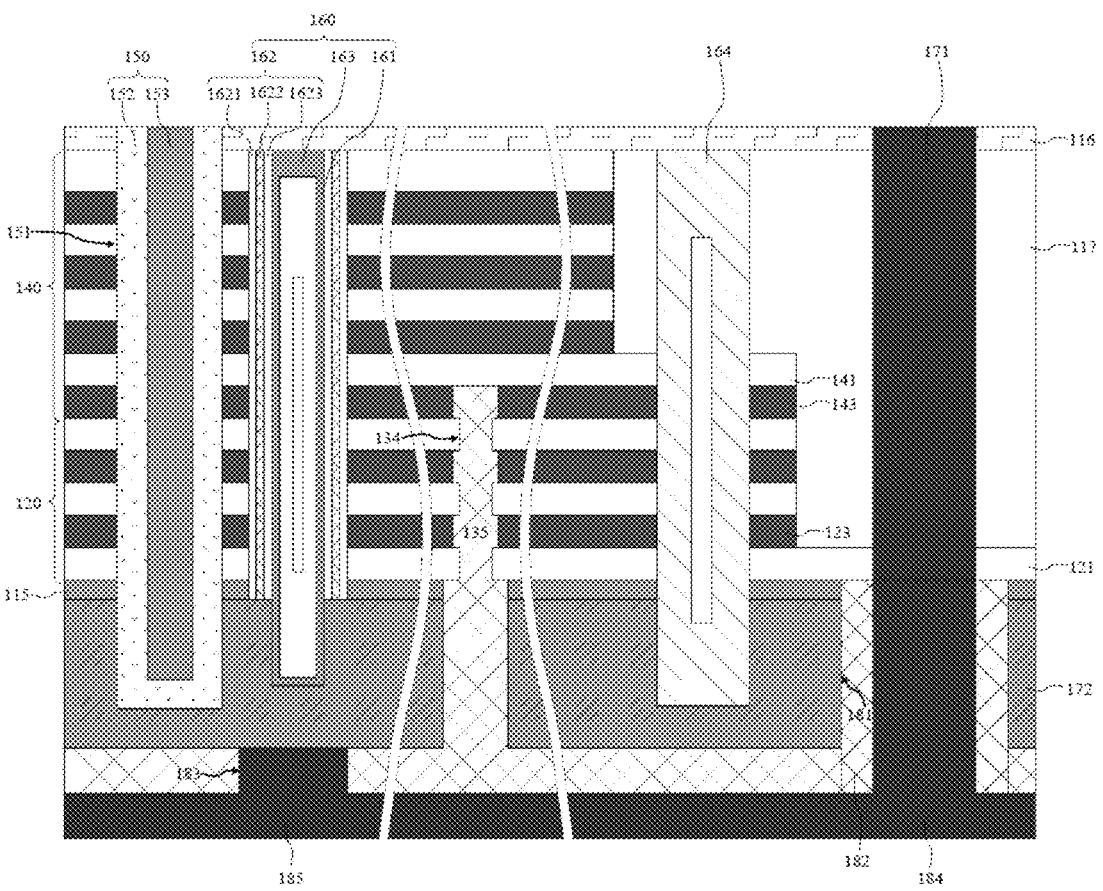
Figure 3:
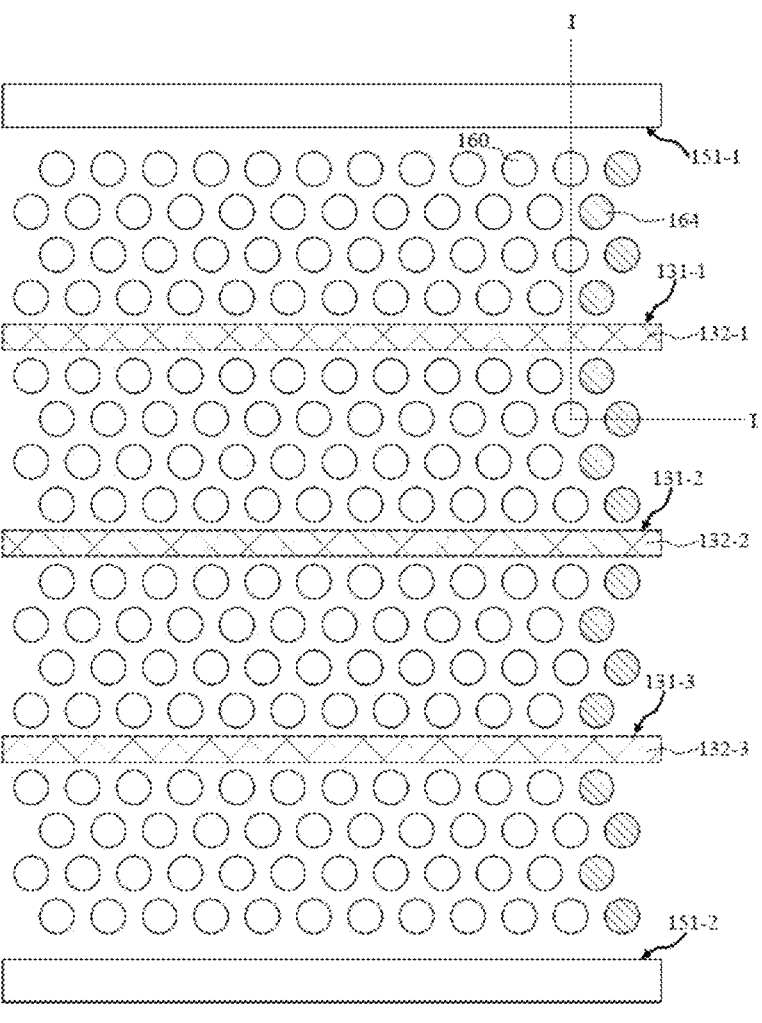
FIG. 3 is a schematic process top view of forming gate slits according to an implementation of the present disclosure.

It should be understood that the steps shown in the fabrication method 1000 are not exclusive, and other steps may also be performed before, after, or between any of the steps as shown. Furthermore, some of the steps may be performed simultaneously, or may be performed in a different order from that shown in FIG. 1. FIGS. 2A to 2O are process sectional views of a fabrication method 1000 of a three-dimensional memory according to an implementation of the present disclosure. FIG. 3 is an illustrative top view of forming gate slits according to an implementation of the present disclosure. The above steps S110 to S160 are further described below with reference to FIGS. 2A to 2O and FIG. 3.

S110: Forming a first stack structure on a substrate.

In step S110, the substrate 110 (referring to FIG. 2A) may, for example, comprise a semiconductor material of silicon (e.g., monocrystalline silicon, polysilicon), silicon germanium (SiGe), germanium (Ge), silicon on insulator (SOI), germanium on insulator (GOI), gallium arsenide (GaAs), gallium nitride (GaN), silicon carbide (SiC), glass, III-V compound semiconductors, or any combination thereof. Exemplarily, the substrate 110 may be used to provide mechanical support for structures formed thereon, such as the first stack structure 120, a second stack structure 140 (referring to FIG. 2D), and channel structures 160 (referring to FIG. 2E), etc.

In some implementations, as shown in FIG. 2A, the substrate 110 may comprise a silicon base 111, as well as a first silicon oxide layer 112, a first polysilicon layer 113, and a second silicon oxide layer 114 that are located on the silicon base 111 in sequence. Exemplarily, a method of forming the first silicon oxide layer 112, the first polysilicon layer 113, and the second silicon oxide layer 114 on the silicon base 111 may comprise, but not limited to, chemical vapor deposition (CVD), physical vapor deposition (PVD), atomic layer deposition (ALD), thermal oxidation, or any combination thereof. The substrate 110 may be removed during subsequent processes. Exemplarily, disposing the first silicon oxide layer 112, the first polysilicon layer 113, and the second silicon oxide layer 114 on the silicon base 111 may be beneficial to control the uniformity of a removal process (e.g., an etching process) during the process of removing the substrate 110.

In this step, the first stack structure 120 may comprise a plurality of dielectric layers (e.g., first dielectric layers 121) and a plurality of gate sacrificial layers (e.g., first gate sacrificial layers 122) which are alternately stacked in a direction perpendicular to or approximately perpendicular to the substrate 110. Exemplarily, a surface of the first stack structure 120 far away from the substrate 110 may be a surface of the first dielectric layer 121. Exemplarily, a formation method of the first stack structure 120 may include a thin film deposition process, such as CVD, PVD, ALD, or any combination thereof. Exemplarily, the first gate sacrificial layers 122 on the side of the first stack structure 120 far away from the substrate 110 may be exposed by controlling the number of the first dielectric layers 121 and the first gate sacrificial layers 122. Exemplarily, the first stack structure 120 may comprise at least one of first gate sacrificial layers 122, and the first gate sacrificial layers 122 may be replaced by first gate conductive layers during subsequent processes and may serve as, for example, gates of select transistors.

In some implementations, the first gate sacrificial layers 122 may be removed to form sacrificial gaps, and during a process of removing the first gate sacrificial layers 122, the first dielectric layers 121 and the first gate sacrificial layers 122 may have different etching selection ratios. Optionally, the material of the first dielectric layers 121 may comprise, for example, silicon oxide, and the material of the first gate sacrificial layers 122 may comprise, for example, silicon nitride.

In some implementations, before forming the first stack structure 120 on the substrate 110, a second polysilicon layer 115 may be formed on the substrate 110 (for example, the second silicon oxide layer 114), so that the second polysilicon layer 115 is located between the first stack structure 120 and the substrate 110. In other implementations, the first stack structure 120 may be directly formed on the substrate 110, so that there is no second polysilicon layer 115 between the substrate 110 and the first stack structure 120, which is not specifically restricted by the present disclosure.

S120: Forming bottom select gate cuts through the first stack structure, and forming first sacrificial layers within the bottom select gate cuts.

Figure 2B:
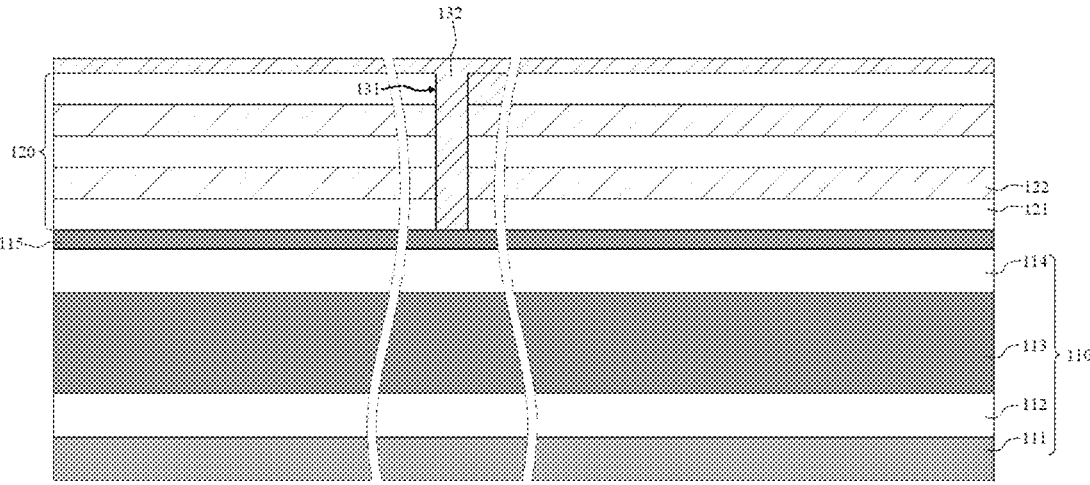
Figure 2C:
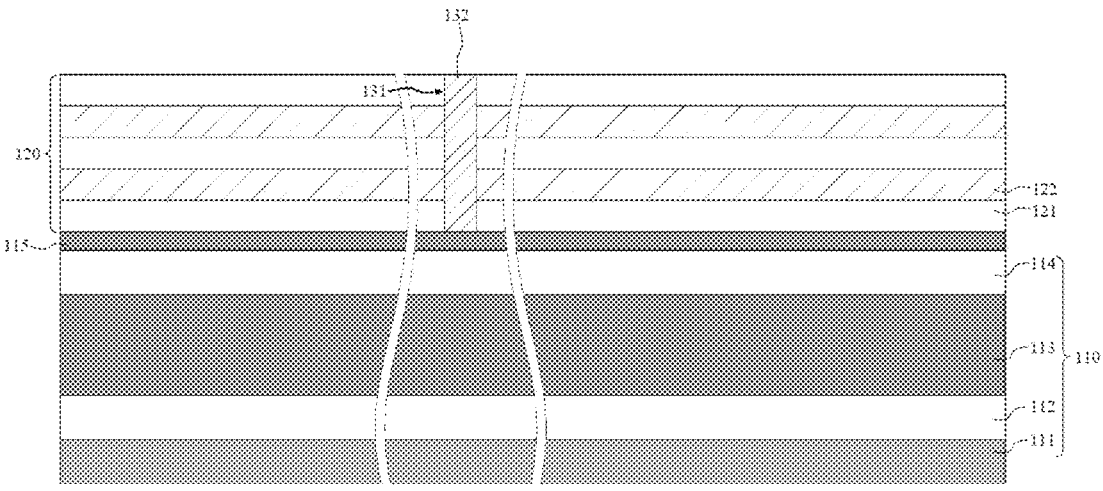

In step S120, as shown in FIG. 2B, the bottom select gate cut 131 through the first stack structure 120 may be formed within a predetermined region using photolithography and etching processes (for example, a wet or dry etching process). The bottom select gate cut 131 may extend along (referring to FIG. 3) a first direction parallel to or approximately parallel to the substrate 110 (for example, a direction perpendicular to or approximately perpendicular to sections of the bottom select gate cut 131 as shown in FIG. 2B) to separate the first gate sacrificial layers 122 on two sides of the bottom select gate cut 131, thereby separating first gate conductive layers 123 formed in subsequent processes on the two sides of the bottom select gate cut 131. In this step, the first sacrificial layers 132 may be formed within the bottom select gate cut 131 using a thin film deposition process, such as CVD, PVD, ALD, or any combination thereof. Optionally, the first sacrificial layers 132 may cover the surfaces of the first dielectric layers 121 of the first stack structure 120 during the process of forming the first sacrificial layers 132. Optionally, portions of the first sacrificial layers 132 on the surface of the first stack structure 120 may be removed using, for example, a chemical mechanical polishing (CMP) process to re-expose the first dielectric layers 121 in the first stack structure 120, as shown in FIG. 2C. In other words, a portion of the first sacrificial layers 132 may be removed to make the first sacrificial layers 132 remain within the bottom select gate cut 131. It should be noted that, during the process of forming the first sacrificial layers 132, the first sacrificial layers 132 may be only formed within the bottom select gate cut 131, instead of on the surface of the first stack structure 120, for example, by controlling a thin film deposition process, which is not specifically restricted by the present disclosure.

In some implementations, the first sacrificial layers 132 may be fabricated using the same material, for example, silicon nitride, as the first gate sacrificial layers 122 in the first stack structure 120.

S130: Forming a second stack structure covering the first sacrificial layers and the first stack structure, wherein both the first stack structure and the second stack structure comprise alternately stacked dielectric layers and gate sacrificial layers.

Figure 2D:
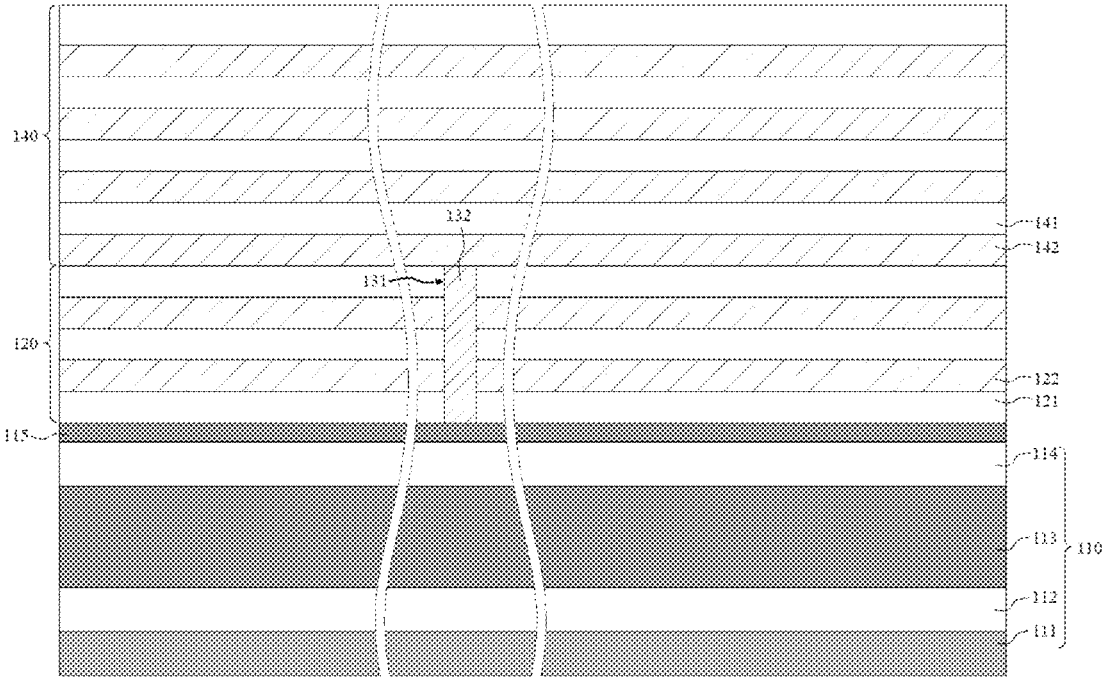

In step S130, as shown in FIG. 2D, the second stack structure 140 may be formed on the side of the first stack structure 120 far away from the substrate 110, and covers the first sacrificial layers 132 and the first stack structure 120. Similar to the first stack structure 120, the second stack structure 140 may comprise a plurality of gate sacrificial layers (e.g., second gate sacrificial layers 142) and a plurality of dielectric layers (e.g., second dielectric layers 141) which are alternately stacked in a direction perpendicular to or approximately perpendicular to the substrate 110. Optionally, the second dielectric layers 141 and the second gate sacrificial layers 142 in the second stack structure 140 may be fabricated using the same materials as those of the first dielectric layers 121 and the first gate sacrificial layers 122 in the first stack structure 120. Optionally, the second stack structure 140 may be formed using a process similar to that of the first stack structure 120. The number of stack layers of the second dielectric layers 141 and the second gate sacrificial layers 142 in the second stack structure 140 may be, for example, 8, 32, 64, 128, etc. The number of stack layers and stack heights of the first stack structure 120 and the second stack structure 140 may be designed according to actual storage demands, which are not specifically restricted by the present disclosure. The second gate sacrificial layers 142 may be replaced by second gate conductive layers during subsequent processes, and may serve as, for example, gates of memory cells.

In some implementations, during the process of forming the second stack structure 140, a second gate sacrificial layer 142 covering the first stack structure 120 and the first sacrificial layers 132 may be formed first, and then the second dielectric layers 141 and the second gate sacrificial layers 142 are alternately formed on that second gate sacrificial layer 142. In other words, the first sacrificial layers 132 are in contact with the second gate sacrificial layers 142 in the second stack structure 140. As described above, the first stack structure 120 and the second stack structure 140 may comprise continuously and alternately stacked dielectric layers (for example, the first dielectric layers 121 and the second dielectric layers 141) and gate sacrificial layers (for example, the first gate sacrificial layers 122 and the second gate sacrificial layers 142).

S140: Replacing the first sacrificial layers with first conductive layers and replacing the gate sacrificial layers with gate conductive layers.

Figure 2E:
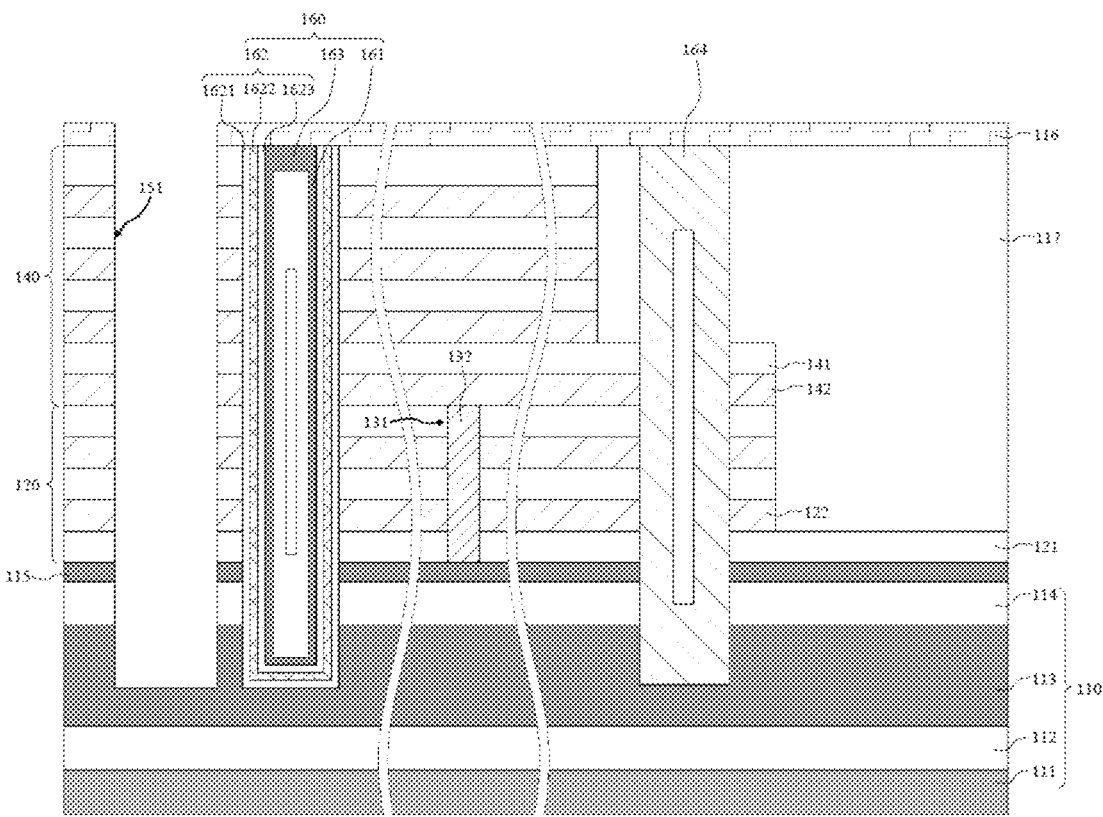

In some implementations of step S140, as shown in FIG. 2E, gate slit 151 running through (for example, running through in sequence) the second stack structure 140, and the first stack structure 120 may be formed within a predetermined region using photolithography and etching processes (for example, a wet or dry etching process). Optionally, the gate slit 151 may extend into, for example, the first polysilicon layer 113 of the substrate 110. The gate slit 151 may extend along a first direction parallel to or approximately parallel to the substrate 110 (for example, a direction perpendicular to or approximately perpendicular to sections of the gate slit 151 as shown in FIG. 2E) to divide the first stack structure 120, the second stack structure 140 and a plurality of channel structures 160 formed in both of them into memory blocks. (Referring to FIG. 3).

In some implementations, the channel structures 160 run through (for example, run through in sequence) the second stack structure 140 and the first stack structure 120, and extend into the first polysilicon layer 113 of the substrate 110 along a direction facing towards the substrate 110, for example, a direction perpendicular to the substrate 110. Exemplarily, the channel structures 160 may have, for example, an approximate profile shape such as a cylinder, a truncated cone, or a prismoid, or the like. The channel structures 160 may comprise, for example, outer wall structures of function layers 162 and channel layers 161 that are disposed in sequence from outside to inside. Optionally, the function layers 162 may comprise, for example, charge blocking layers 1621, charge trap layers 1622, and tunneling layers 1623 that are disposed in sequence from outside to inside. Materials of the charge blocking layers 1621, the charge trap layers 1622, and the tunneling layers 1623 may comprise, for example, silicon oxide, silicon nitride, and silicon oxide in sequence, thereby forming the function layers 162 with ONO structures. The material of the channel layers 161 may comprise a semiconductor material, for example, silicon (such as amorphous silicon, polysilicon, monocrystalline silicon), etc. Exemplarily, a plurality of channel structures 160 may be arranged in line (for example, in line in an interleaved manner) on a plane parallel to the substrate 110 (referring to FIG. 3).

In some implementations, the channel structures 160 may be formed, for example, before forming the gate slit 151. Exemplarily, the channel structures 160 may be formed using photolithography and etching processes (for example, a dry or wet etching process) and a thin film deposition process. Exemplarily, channel holes running through (for example, running through in sequence) the second stack structure 140 and the first stack structure 120 and extending into, for example, the first gate sacrificial layers 122, may be formed first using photolithography and etching processes. Further, the function layers 162 comprising the charge blocking layers 1621, the charge trap layers 1622, and the tunneling layers 1623 together with the channel layers 161 may be formed on the inner walls of the channel holes in sequence using a thin film deposition process, such as CVD, PVD, ALD or any combination thereof. Optionally, a dielectric material such as silicon oxide may be filled in the channel holes where the function layers 162 and the channel layers 161 are formed, using a thin film deposition process, such as CVD, PVD, ALD, or any combination thereof.

In some implementations, the channel structures 160 may further comprise channel plugs 163 at the end of the channel structures 160 far away from the substrate 110. The channel plugs 163 may be fabricated using the same semiconductor material as the channel layers 161, and contact with the channel layers 161. The channel plugs 163 may function as, for example, drains of the channel structures 160. It may be understood that portions of the function layers 162 and the channel layers 161 in the channel structures 160 corresponding to, for example, each of the second gate sacrificial layers 142 (i.e., the second gate conductive layers formed subsequently) in the second stack structure 140, together with a portion of those second gate sacrificial layers 142, jointly form memory cells.

In some implementations, after forming the channel structures 160, a first insulating layer 116 covering the end face of the channel structures 160 far away from the substrate 110 and the surface of the second stack structure 140 far away from the substrate 110 may be formed. Exemplarily, the gate slit 151 may run through (for example, run through in sequence) the first insulating layer 116, the second stack structure 140, and the first stack structure 120.

In some implementations, a step structure (not shown) may be formed, for example, at edges of the second stack structure 140 and the first stack structure 120, and may be formed by performing a 'trim-etch cycle' process multiple times on a plurality of dielectric layers (for example, the first dielectric layers 121 and the second dielectric layers 141) and a plurality of sacrificial layers (for example, the first gate sacrificial layers 122 and the second gate sacrificial layers 142) which are alternately stacked. Optionally, the side of the step structure far away from the substrate 110 may be filled with at least one insulating material 117, such as silicon oxide, silicon nitride, silicon oxynitride, or any combination thereof. Optionally, the first insulating layer 116 may cover a surface of the insulating material 117 far away from the substrate 110.

In some implementations, dummy channel structures 164 run through at least part of the second stack structure 140 and/or the first stack structure 120 in regions corresponding to the step structures, and extend into, for example, the first polysilicon layer 113 of the substrate 110 along a direction facing towards the substrate 110 such as a direction perpendicular to the substrate 110. Exemplarily, the dummy channel structures 164 may have similar profile shapes and internal structures to the channel structures 160, and the process method of forming the dummy channel structures 164 is also similar to that of forming the channel structures 160. As an option, after forming dummy channel holes, at least one insulating material may be directly filled within the dummy channel holes using a thin film deposition process, such as CVD, PVD, ALD, or any combination thereof. Exemplarily, the dummy channel holes may, for example, be filled with silicon oxide. Functions of the dummy channel structures 164 include, but not limited to, providing mechanical support or load balance.

In some implementations, FIG. 3 shows a top view of a semiconductor structure after forming gate slits 151-1 and 151-2, wherein FIG. 2E is a schematic sectional view of the semiconductor structure taken along the section line I-I' in FIG. 3. Exemplarily, a plurality of gate slits (for example, 151-1 and 151-2) may be formed synchronously in a predetermined region, for example, by mask design and using photolithography and etching processes (for example, a wet or dry etching process). The gate slits 151-1 and 151-2 may extend, for example, in parallel or approximately in parallel to each other. It should be noted that similar to a plurality of gate slits 151-1 and 151-2, a plurality of bottom select gate cuts (for example, 131-1 to 131-3) may be formed synchronously in step S120 by mask design. Also, a plurality of first sacrificial layers (for example, 132-1 to 132-3) may be formed within a plurality of bottom select gate cuts respectively using, for example, a thin film deposition process, and the bottom select gate cuts 131-1 to 131-3 extend in parallel or approximately in parallel between the adjacent gate slits 151-1 and 151-2. It should be noted that the number of the bottom select gate cuts between the adjacent gate slits 151-1 and 151-2 shown in FIG. 3 is only exemplary. Optionally, the number of the bottom select gate cuts between the adjacent gate slits 151-1 and 151-2 may be greater than or equal to 2.

In some implementations of step S140, referring to FIG. 3, the second gate sacrificial layers 142 in the second stack structure 140, the first gate sacrificial layers 122 in the first stack structure 120, and the first sacrificial layers 132 may be removed via the gate slits 151-1 and 151-2 using, for example, a wet etching process. During the process of removing the above structures, in the case that the adjacent gate slits 151-1 and 151-2 include more than two (for example, three) first sacrificial layers 132-1 to 132-3 therebetween, an etching material (for example, etching liquid) may remove the first gate sacrificial layers 122 between the bottom select gate cuts 131-1 and 131-3 via gaps formed after removing the first sacrificial layers 132-1 and/or 132-3. Optionally, in the case that the first gate sacrificial layers 122, the second gate sacrificial layers 142, and the first sacrificial layers 132 are of the same material, the above structures may be removed using the same etching process (for example, the etching liquid) during the same process. After the above process treatment, sacrificial gaps (not shown) are formed within spaces of the first gate sacrificial layers 122, the second gate sacrificial layers 142, and the first sacrificial layers 132.

Figure 2F:
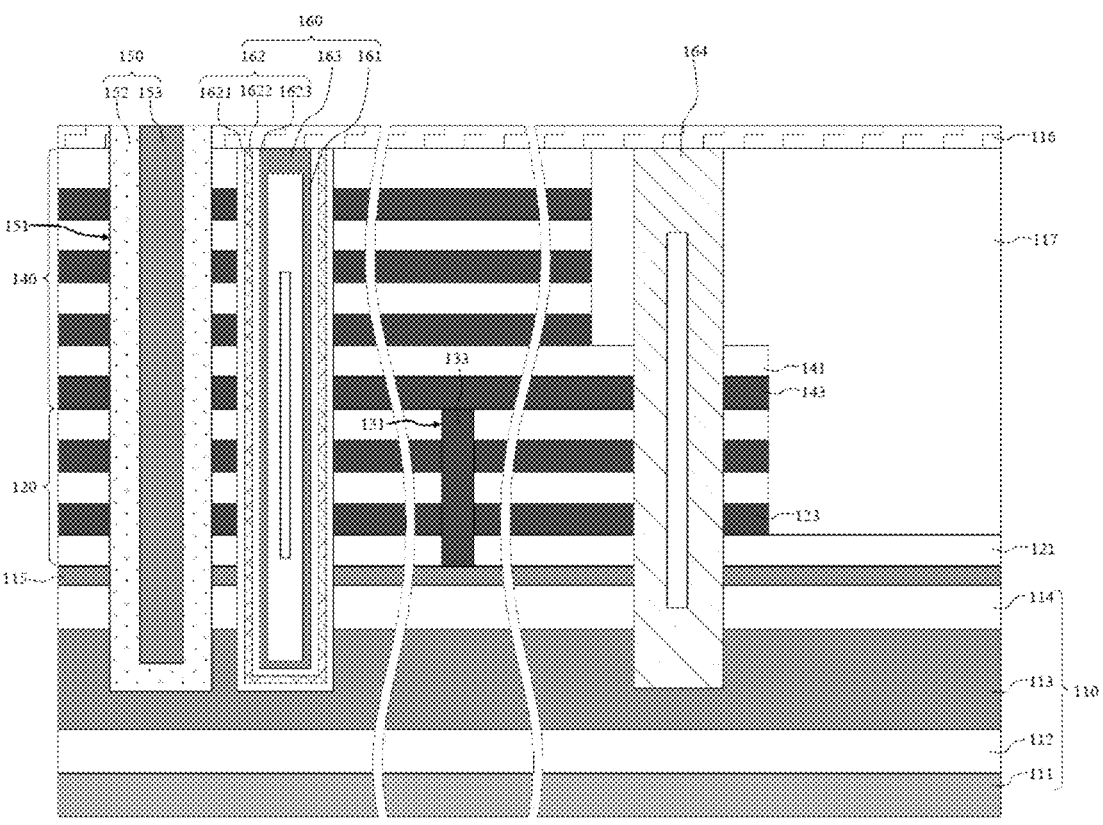

In some implementations of this step, as shown in FIG. 2F, after forming the sacrificial gaps, first gate conductive layers 123 are formed within spaces of the sacrificial gaps corresponding to the removed first gate sacrificial layers 122, and second gate conductive layers 143 are formed within spaces of the sacrificial gaps corresponding to the removed second gate sacrificial layers 142, and first conductive layers 133 are formed within spaces of the sacrificial gaps corresponding to the removed first sacrificial layers 132. Optionally, materials of the first gate conductive layers 123, the second gate conductive layers 143, and the first conductive layers 133 may comprise a conductive material, such as tungsten, cobalt, copper, aluminum, doped polysilicon, silicide, or any combination thereof. Optionally, in the case that the materials of the first gate conductive layers 123, the second gate conductive layers 143, and the first conductive layers 133 are the same, the above structures may be removed during the same process. The process method described above for replacing the first gate sacrificial layers 122 with the first gate conductive layers 123 and replacing the second gate sacrificial layers 142 with the second gate conductive layers 143 may be referred to as a "gate replacement" process. It may be understood that, in this step, other process methods known in the art may also be used to replace the first sacrificial layers 132 with the first conductive layers 133, replace the first gate sacrificial layers 122 with the first gate conductive layers 123, and replace the second gate sacrificial layers 142 with the second gate conductive layers 143, which is not specifically restricted by the present disclosure.

In some implementations, after the above process treatment, a second insulating layer 152 may be formed on the inner wall of the gate slit 151 (for example, the sidewall and bottom of the gate slit 151) using a thin film deposition process, such as CVD, PVD, ALD, or any combination thereof. Optionally, a conductive material 153 may be filled within the gate slit 151 where the second insulating layer 152 is formed using a thin film deposition process such as CVD, PVD, ALD, or any combination thereof, in order to form gate slit structures 150. Optionally, the material of the second insulating layer 152 may comprise, for example, silicon oxide, silicon nitride, silicon oxynitride, or any combination thereof. The conductive material 153 may comprise, for example, tungsten, cobalt, copper, aluminum, doped polysilicon, or any combination thereof.

Figure 2G:
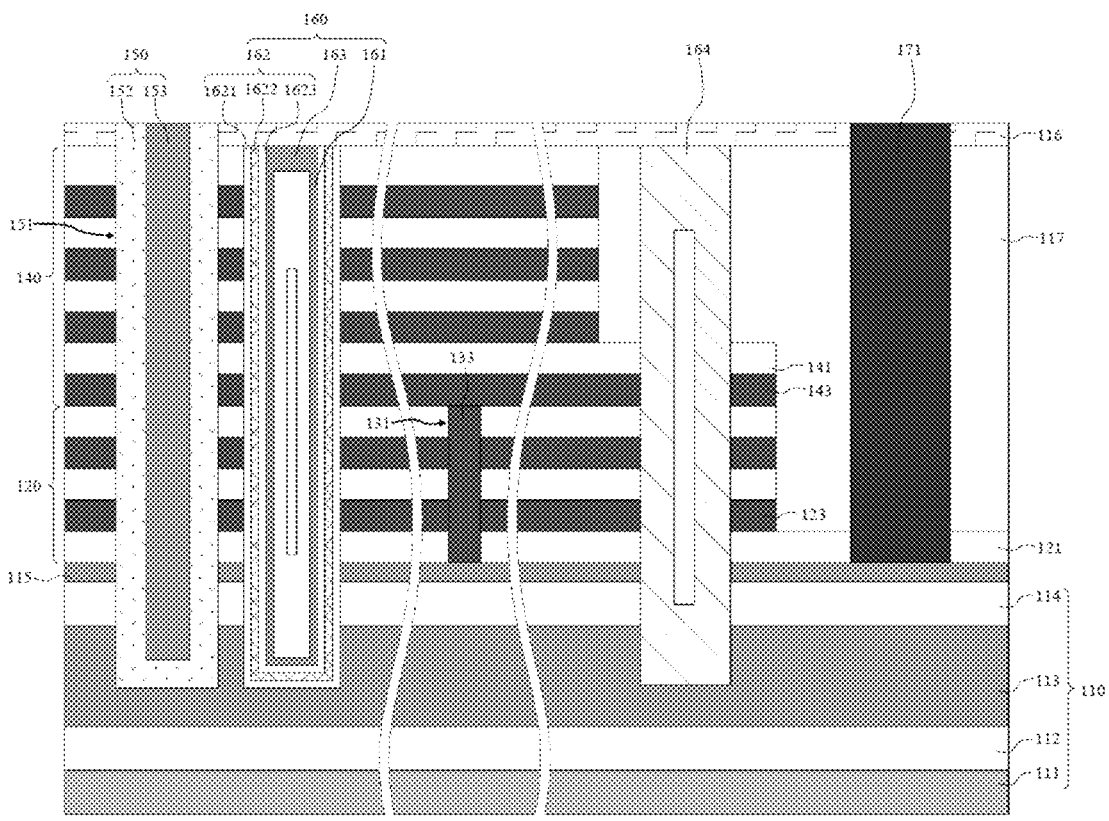

In some implementations, as shown in FIG. 2G, a conductive contact 171 may extend to, for example, the surface of the second polysilicon layer 115 from the surface of the first insulating layer 116 far away from the substrate 110 along a direction facing towards the substrate 110, such as a direction perpendicular to the substrate 110. Exemplarily, the conductive contact 171 may be used for transmitting electrical signals, or achieving interaction with external circuit signals. Optionally, the material of the conductive contact 171 may comprise a conductive material, such as tungsten, cobalt, copper, aluminum, or doped polysilicon, or the like.

Figure 2H:
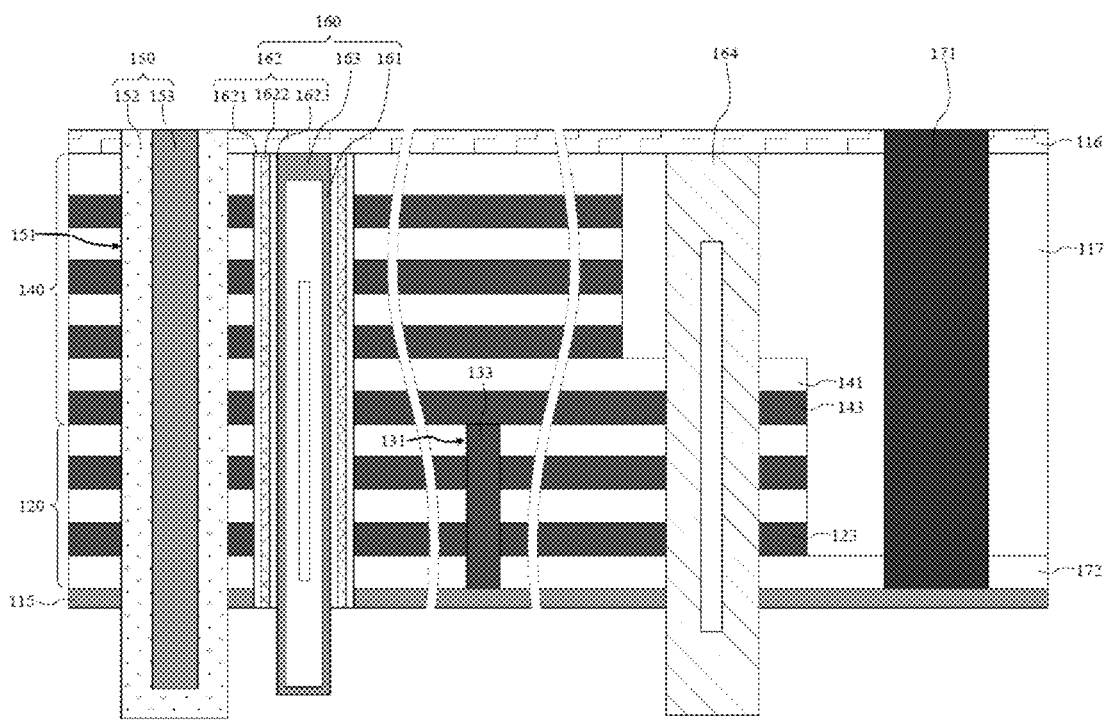

In some implementations, the fabrication method 100 of the three-dimensional memory may further comprise a step of electrically connecting the channel layers 161 in the channel structures 160 with an active layer (for example, a semiconductor layer 172). Exemplarily, as shown in FIG. 2H, the silicon base 111, the first silicon oxide layer 112, the first polysilicon layer 113, and the second silicon oxide layer 114 in the substrate 110 may be removed (for example, removed in sequence) using, for example, a CMP process, a wet etching process, and a dry etching process. In the case that the substrate 110 comprises a multi-layer structure, the first silicon oxide layer 112 may act as, for example, a stop layer for removing the silicon base 111, and the first polysilicon layer 113 may act as, for example, a stop layer for removing the first silicon oxide layer 112, and the second silicon oxide layer 114 may act as, for example, a stop layer for removing the first polysilicon layer 113, thereby being beneficial to control the uniformity of the removal process (e.g., the etching process). After the above process treatment, for example, portions of the channel structures 160 extending into the substrate 110, portions of the gate slit structures 150 extending to the substrate 110, and portions of the dummy channel structures 164 extending into the substrate may be exposed.

Figure 2I:
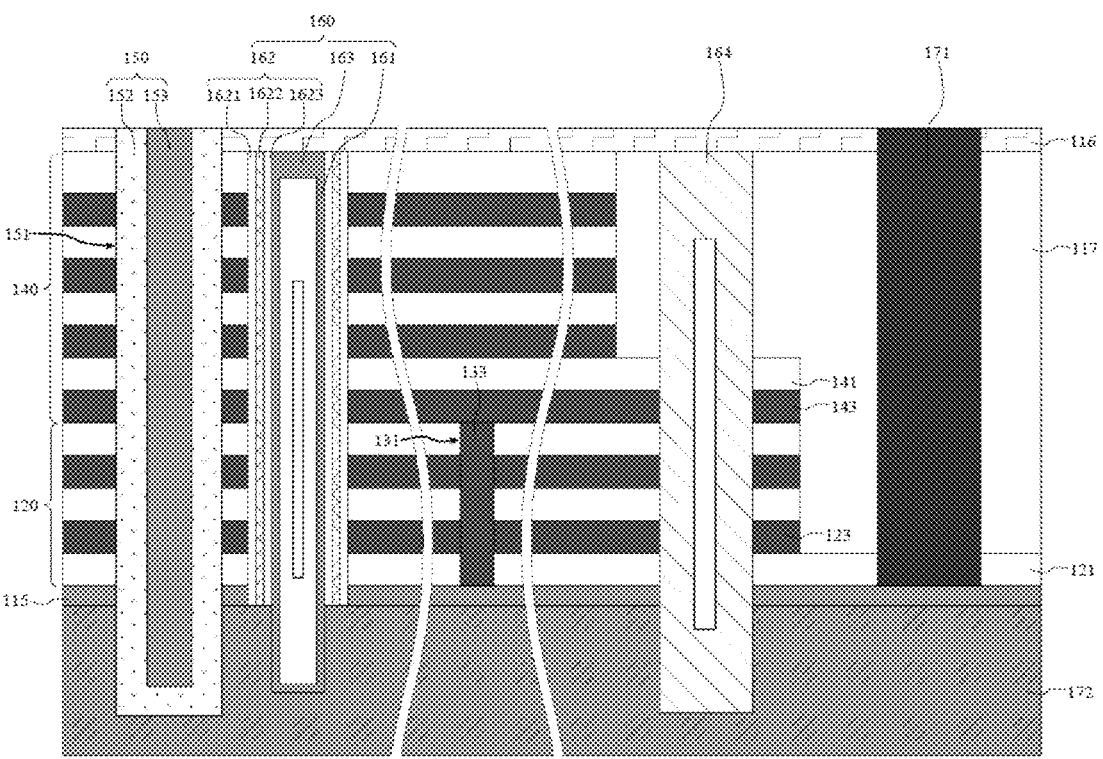

In some implementations, after removing the substrate 110, the function layers 162 in the exposed portions of the channel structures 160 may be removed using photolithography and etching processes (for example, a dry or wet etching process) to expose a portion of the channel layers 161. Optionally, the second polysilicon layer 115 may act as a stop layer for removing the function layers 162 in the exposed portions of the channel structures 160. Further, as shown in FIG. 2I, the semiconductor layer 172 in contact with the exposed portions of the channel layers 161 may be formed using a thin film deposition process, such as CVD, PVD, ALD, or any combination thereof, to achieve electrical connection of the channel layers 161 with the semiconductor layer 172. Optionally, during the process of forming the semiconductor layer 172, the semiconductor layer 172 may cover the exposed portions of the dummy channel structures 164, the exposed portions of the gate slit structures 150, and the side of the first stack structure 120 far away from the second stack structure 140 (for example, the surface of the second polysilicon layer 115). It should be noted that at least part of the channel layers 161 in a plurality of channel structures 160 may be in contact with the semiconductor layer 172, so that the channel layers 161 in the plurality of channel structures 160 are electrically connected with the semiconductor layer 172. Exemplarily, the semiconductor layer 172 may act as an active layer of the plurality of channel structures 160. It should be noted that the semiconductor layer 172 may be approximately located at the space of the removed substrate 110.

S150: Forming trenches exposing the first conductive layers on the side of the first stack structure far away from the second stack structure.

Figure 2J:
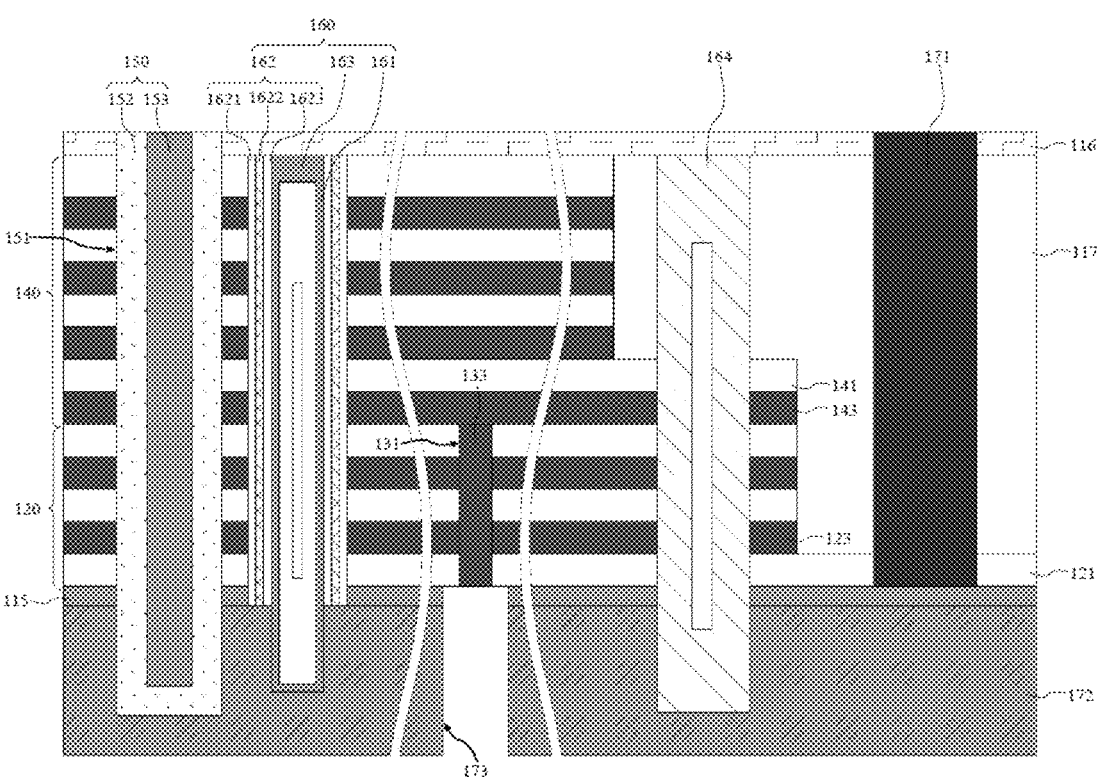

In step S150, as shown in FIG. 2J, a trench 173 running through, for example, the semiconductor layer 172 and exposing the first conductive layers 133 may be formed from the side of the first stack structure 120 far away from the second stack structure 140 using photolithography and etching processes (for example, a wet or dry etching process). Optionally, the trench 173 may extend along a first direction (for example, a direction perpendicular to or approximately perpendicular to the section of the trench 173 as shown in FIG. 2J), and the present disclosure does not specifically define an extending length of the trench 173 in the first direction. Optionally, in the case that the first stack structure 120 comprises a second polysilicon layer 115 on the side close to the semiconductor layer 172, the trench 173 may run through the semiconductor layer 172 and the second polysilicon layer 115.

In some implementations, in a second direction parallel to or approximately parallel to the semiconductor layer 172 and intersecting with (e.g., being perpendicular to) the first direction as described above, the width of the trench 173 may be greater than those of the first conductive layers 133. Exemplarily, during a process of etching the trench 173, portions of the trench 173 with a width greater than those of the first conductive layers 133 correspond to the first dielectric layers 121 of the first stack structure 120. The first dielectric layers 121 may act as stop layers for etching the trench 173, which is beneficial to control the process of forming the trench 173. However, the present disclosure does not specifically define the width of the trench 173. In this step, in the above second direction, the width of the trench 173 may be equal to or less than the widths of the first conductive layers 133, which falls within the protection scope of the present disclosure as long as the trench 173 can expose the first conductive layers 133.

S160: Replacing the first conductive layers with insulating layers via the trenches.

Figure 2K:
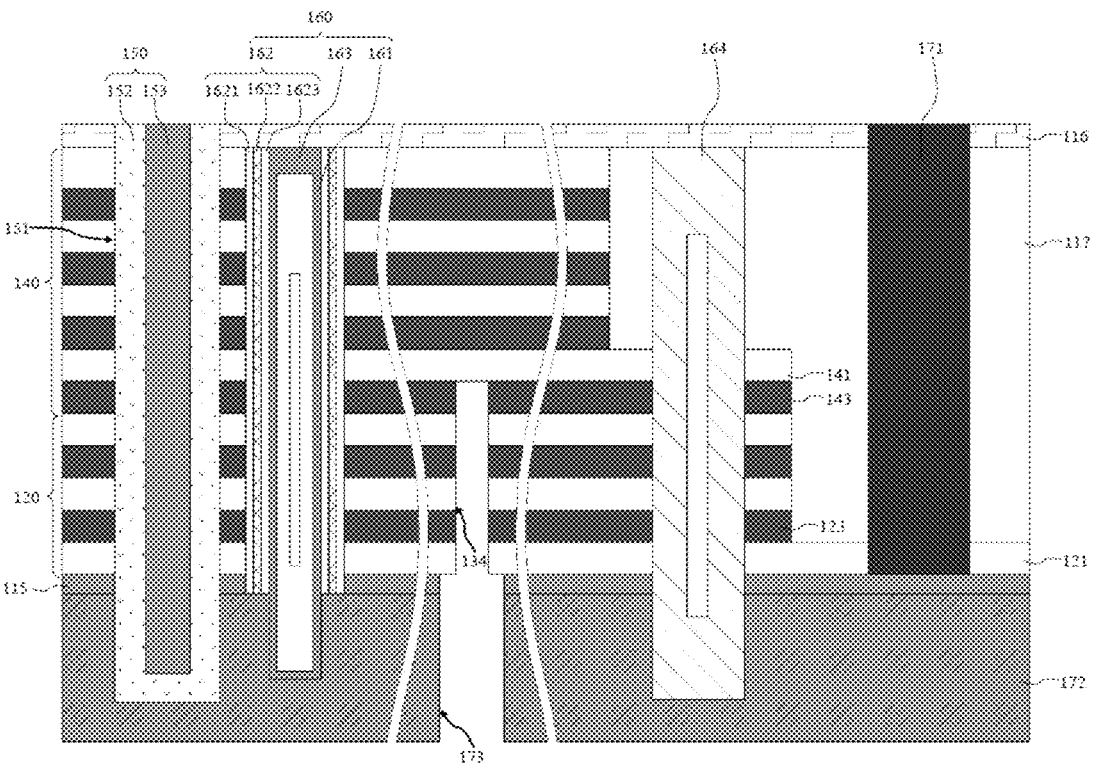
Figure 2L:
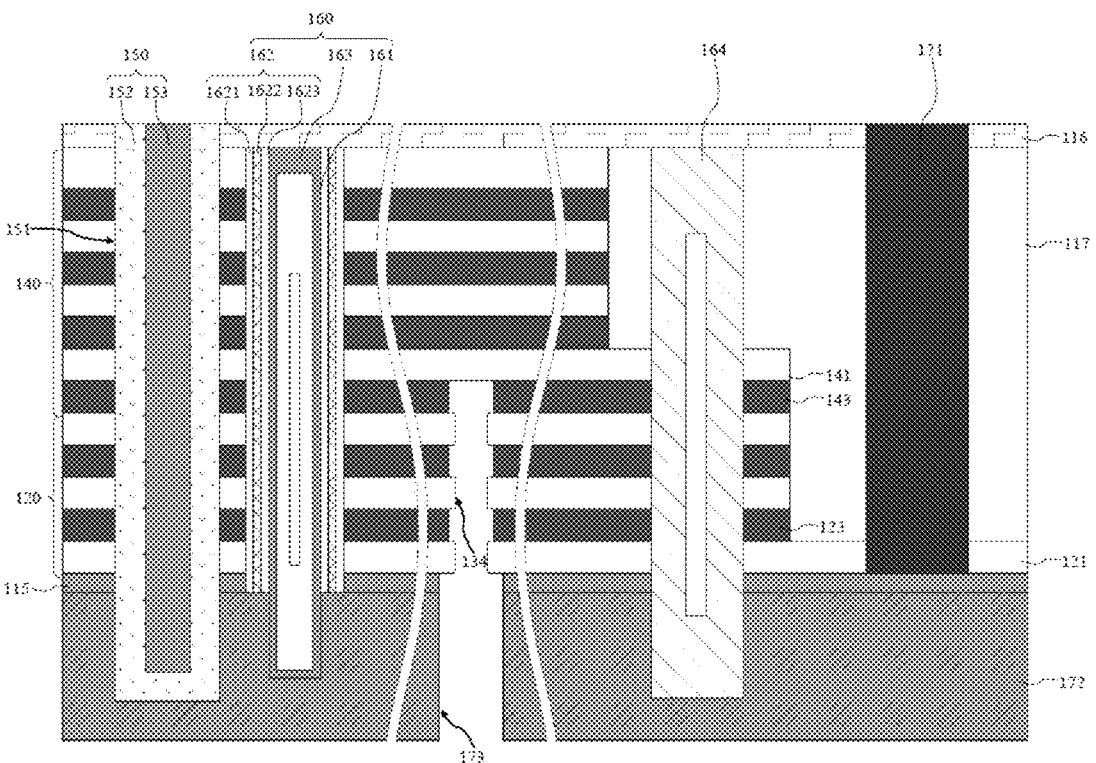

In some implementations of step S160, as shown in FIG. 2K, the first conductive layers 133 may be removed via the trench 173 using, for example, a dry etching process, to restore the bottom select gate cut 131 formed in step S120 to an unfilled state. Optionally, during the process of removing the first conductive layers 133, a portion of the second gate conductive layers 143 in contact with the first conductive layers 133 may be removed in the same etching process to form the filling gap 134 comprising the bottom select gate cut 131. Exemplarily, in the case that the first conductive layers 133 are removed using a dry etching process, the second dielectric layers 141 above the second gate conductive layers 143 may act as stop layers for removing the portions of the second gate conductive layers 143 corresponding to the first conductive layers 133. Exemplarily, as shown in FIG. 2L, after forming the filling gap 134, for example, the ends of the first gate conductive layers 123 and the second gate conductive layers 143 exposed to the filling gap 134 may be etched back, in order to make, for example, the first gate conductive layers 123 and the second gate conductive layers 143 exposed to the filling gap 134 form recesses relative to the sidewalls of the filling gap 134.

Figure 2M:
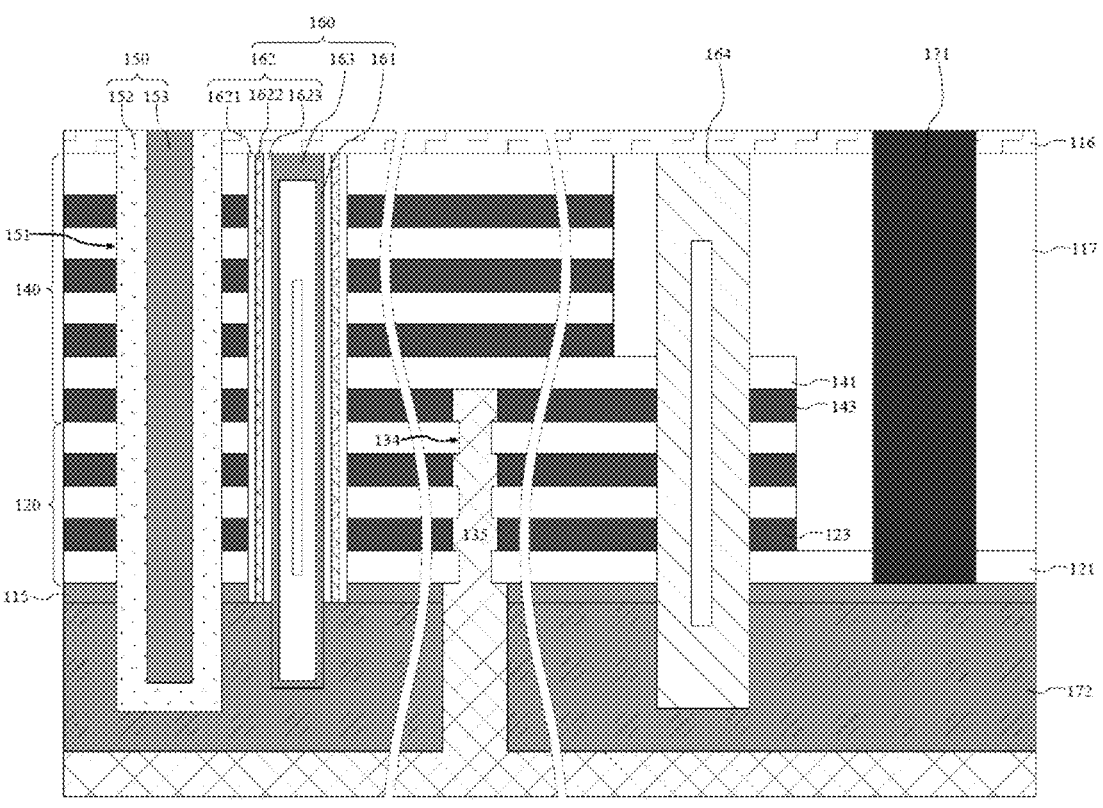

In some implementations of this step, as shown in FIG. 2M, an insulating layer (for example, a third insulating layer 135) may be formed within the filling gap 134 using a thin film deposition process, such as CVD, PVD, ALD, or any combination thereof. Optionally, the material of the third insulating layer 135 may comprise, but not limited to, silicon oxide, silicon nitride, silicon oxynitride, or any combination thereof. After the above process treatment, the third insulating layer 135 within the filling gap 134 may electrically isolate, for example, the first gate conductive layers 123 and at least part of the second gate conductive layers 143 on two sides of the third insulating layer 135. It may be understood that, in this step, other process methods known in the art may also be used to replace the first conductive layers 133 with the third insulating layer 135, which is not specifically restricted by the present disclosure.

In some implementations, the first conductive layers 133 (referring to FIG. 2J) may be at least partially aligned with the trench 173. For example, the symmetry axis of the first conductive layers 133 and symmetry axis of the trench 173 may be disposed non-collinearly. As those described above, the trench 173 may act as a pathway of an etching material (for example, etching liquid), and in the case that the first conductive layers 133 and the trench 173 are not aligned accurately, the etching material (for example, the etching liquid) can also remove the first conductive layers 133, which is beneficial to address the overlay (OVL) problem of the trench 173 and the first conductive layers 133.

In some implementations, during the process of forming the third insulating layer 135 within the filling gap 134, an insulating material for forming the third insulating layer 135 may be filled in the trench 173. It may be understood that the insulating material may be filled in the filling gap 134 and the trench 173, respectively, using a process of stepwise thin film deposition, which is not specifically restricted by the present disclosure. Optionally, during the process of filling the insulating material in the trench 173, the insulating material may cover the side of the semiconductor layer 172 far away from the first stack structure 120, thereby being beneficial to be compatible with the back end of line.

Figure 2N:
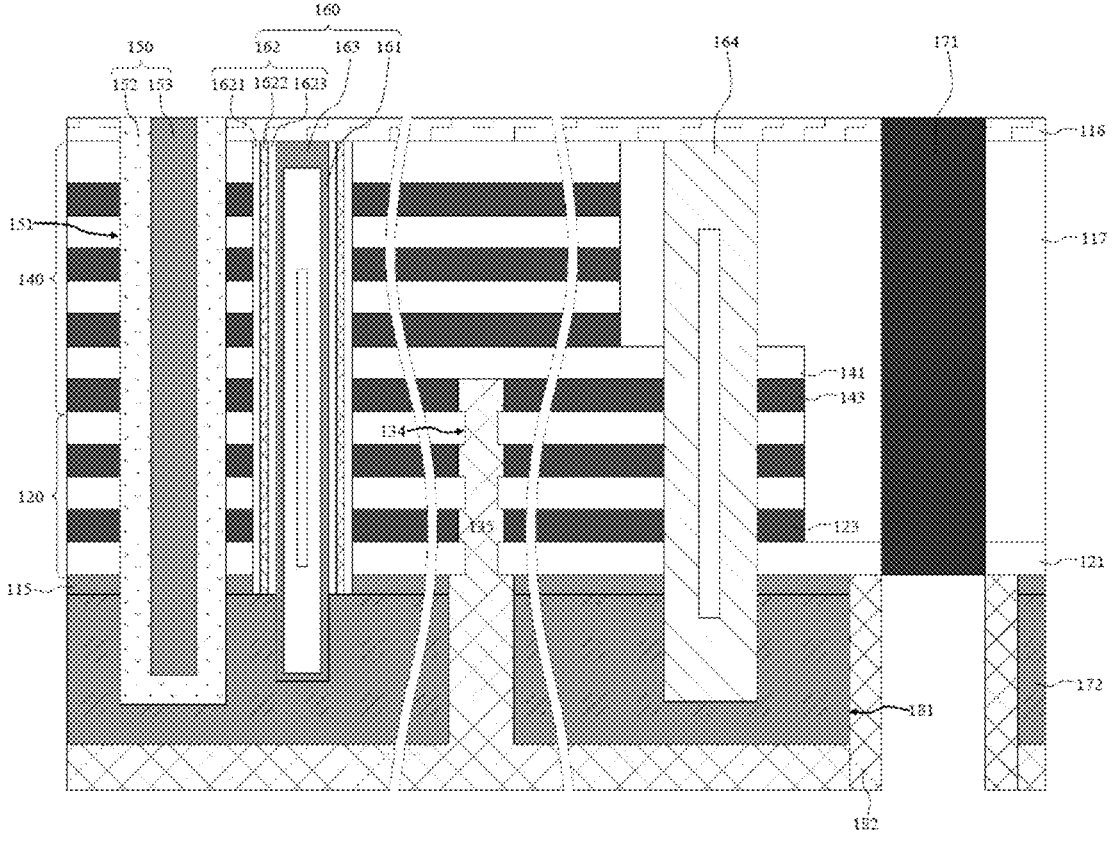

In some implementations, the fabrication method 1000 of the three-dimensional memory further comprises steps of the back end of line. Exemplarily, as shown in FIG. 2N, a first opening 181 through, for example, the semiconductor layer 172 and the second polysilicon layer 115, may be formed using photolithography and etching processes (for example, a dry or wet etching process) to expose the conductive contact 171. Exemplarily, after forming the first opening 181, a sidewall structure 182 may be formed on the sidewalls of the first opening 181 using a thin film deposition process, such as CVD, PVD, ALD, or any combination thereof. The material of the sidewall structure 182 may comprise silicon oxide, silicon nitride, silicon oxynitride, or any combination thereof. Exemplarily, as shown in FIG. 2O, a second opening 183 exposing the semiconductor layer 172 may be formed using photolithography and etching processes (for example, a dry or wet etching process). Exemplarily, after forming the second opening 183, a first pad structure 184 may be formed within the first opening 181 where the sidewall structure 182 is formed, and a second pad structure 185 is formed within the second opening 183, using a thin film deposition process, such as CVD, PVD, ALD or any combination thereof. The material of the first pad structure 184 and/or the second pad structure 185 may comprise a conductive material, such as tungsten, aluminum, copper, or any combination thereof. Exemplarily, the first pad structure 184 may be used for electrically connecting with the conductive contact 171, for example, for transmitting an electrical signal from an external circuit (not shown). The second pad structure 185 is electrically connected with the semiconductor layer 172, and, for example, acts as an electrical connection structure of the semiconductor layer 172 with an external circuit (not shown). It should be noted that since FIG. 2O only shows a portion of the three-dimensional memory after the above process treatment, the first pad structure 184 and the second pad structure 185 may be separated in the portion not shown, so that the first pad structure 184 and the second pad structure 185 are electrically isolated and used for achieving their respective functions.

Figure 4A:
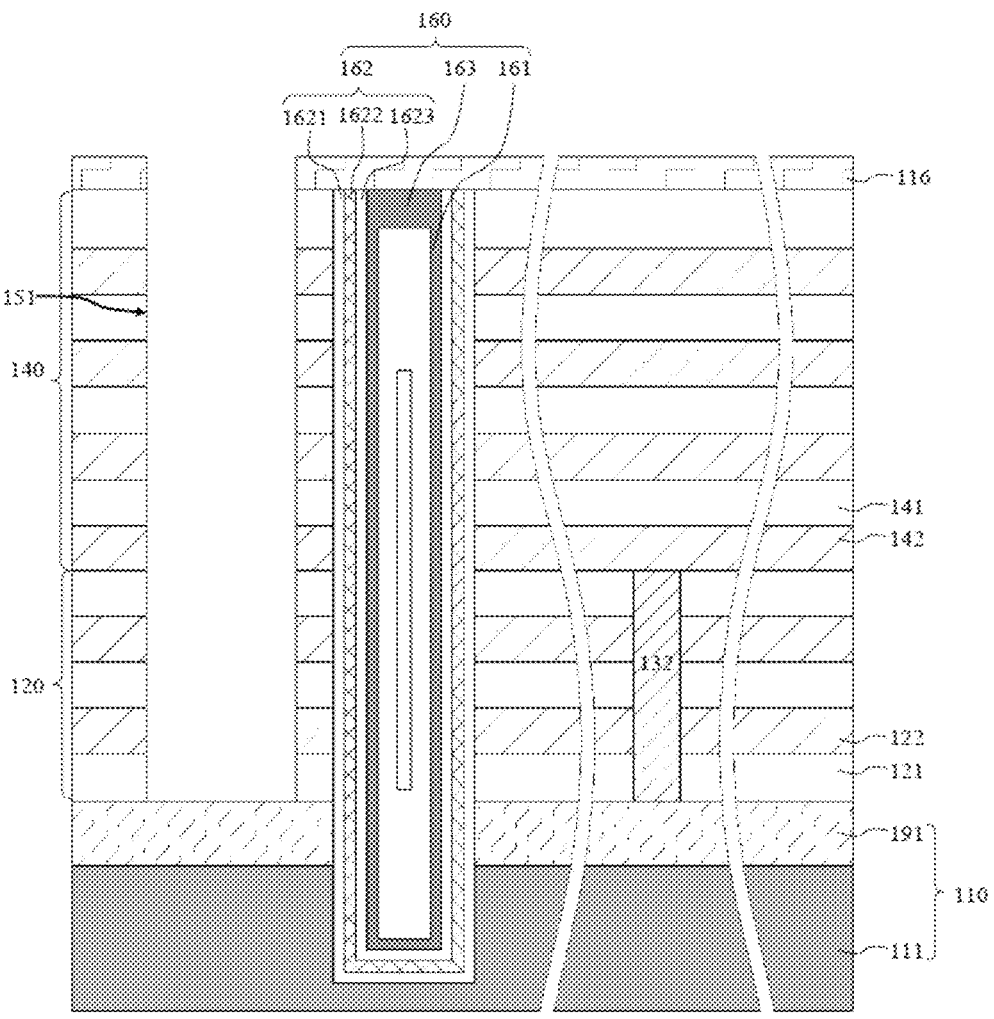
FIGS. 4A to 4C are schematic process sectional views of a fabrication method of a three-dimensional memory according to another implementation of the present disclosure.
Figure 4B:
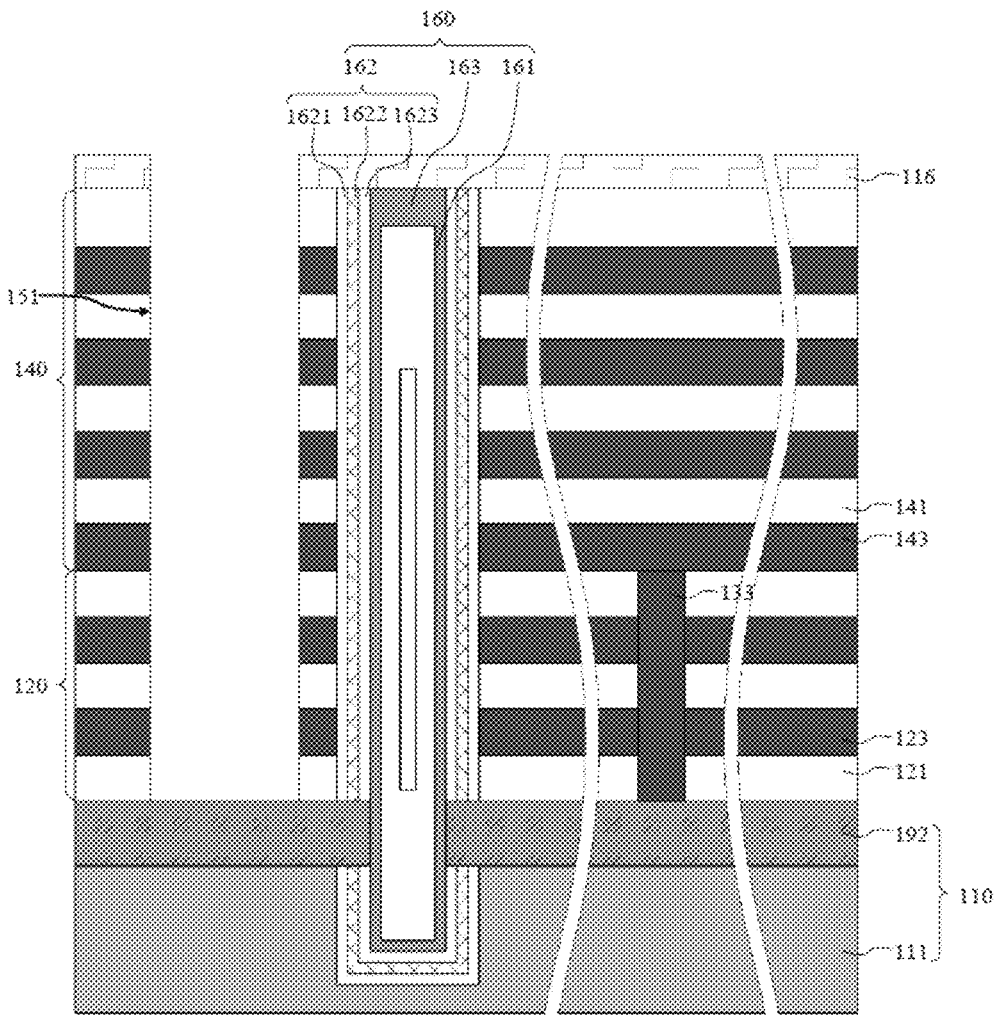
Figure 4C:
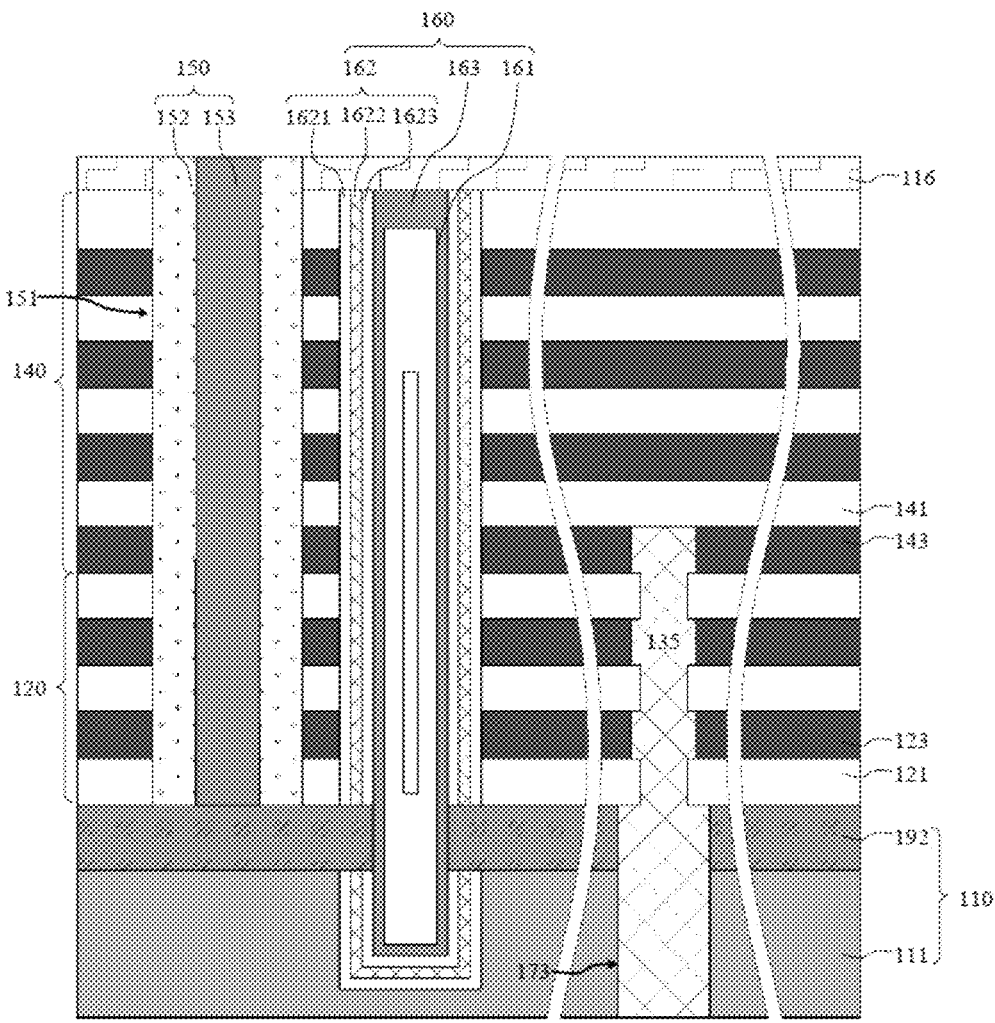

FIGS. 4A to 4C show a process method of electrically connecting channel layers 161 in channel structures 160 with an active layer (for example, a semiconductor material layer 192) of another implementation of the present disclosure. For the purpose of conciseness, the same methods as the steps described above and the resultant structures are not repeated here in the present disclosure.

In some implementations, as shown in FIG. 4A, a substrate 110 may for example, comprise a silicon base 111 and a substrate sacrificial layer 191 on the silicon base 111. Exemplarily, the channel structures 160 may penetrate through the substrate sacrificial layer 191 and extend into the silicon base 111 along a direction facing towards the substrate 110, for example, a direction perpendicular to the substrate 110. Optionally, the material of the substrate sacrificial layer 191 may comprise, for example, polysilicon. In some implementations of S140, the gate slit 151 may, for example, extend to a surface of the substrate sacrificial layer 191. In some implementations of S150, as shown in FIG. 4B, the substrate sacrificial layer 191 and portions of the function layers 162 in the channel structures 160 corresponding to the substrate sacrificial layer 191 may be removed via the gate slit 151 to expose portions of the channel layers 161 corresponding to the substrate sacrificial layer 191. Further, a semiconductor material layer 192 may be formed within a space formed after removing the substrate sacrificial layer 191 using a thin film deposition process such as CVD, PVD, ALD or any combination thereof, to make the semiconductor material layer 192 contact with a portion of the channel layers 161, so that the semiconductor material layer 192 is electrically connected with the channel layers 161.

In some implementations of S160, as shown in FIG. 4C, the trench 173 through, for example, the silicon base 111 and the semiconductor material layer 192 may be formed from the side of the first stack structure 120 far away from the second stack structure 140 using photolithography and etching processes (for example, a wet or dry etching process). Exemplarily, the trench 173 may be used to replace the first conductive layers 133 with the third insulating layer 135 to form bottom select gate cut structures.

Figure 5A:
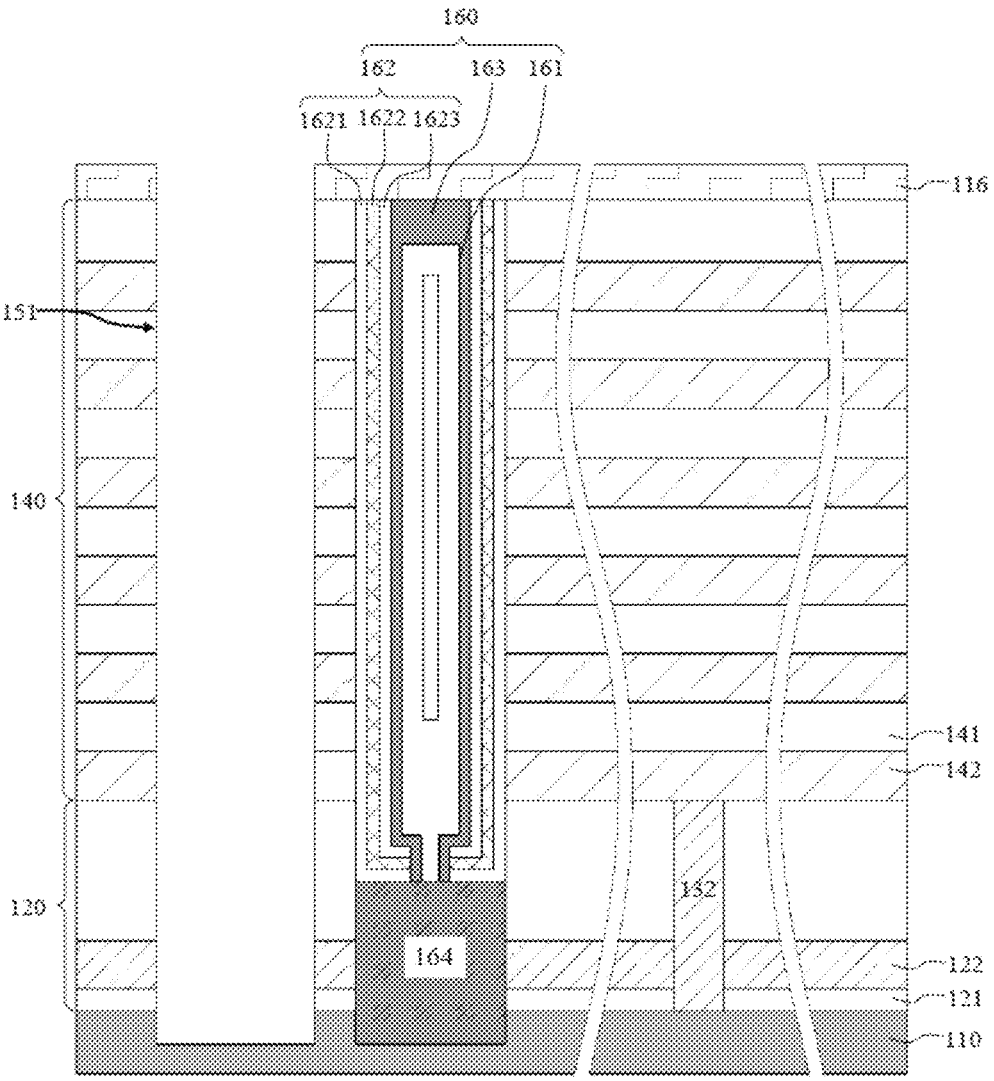
FIGS. 5A to 5B are schematic process sectional views of a fabrication method of a three-dimensional memory according to another implementation of the present disclosure.
Figure 5B:
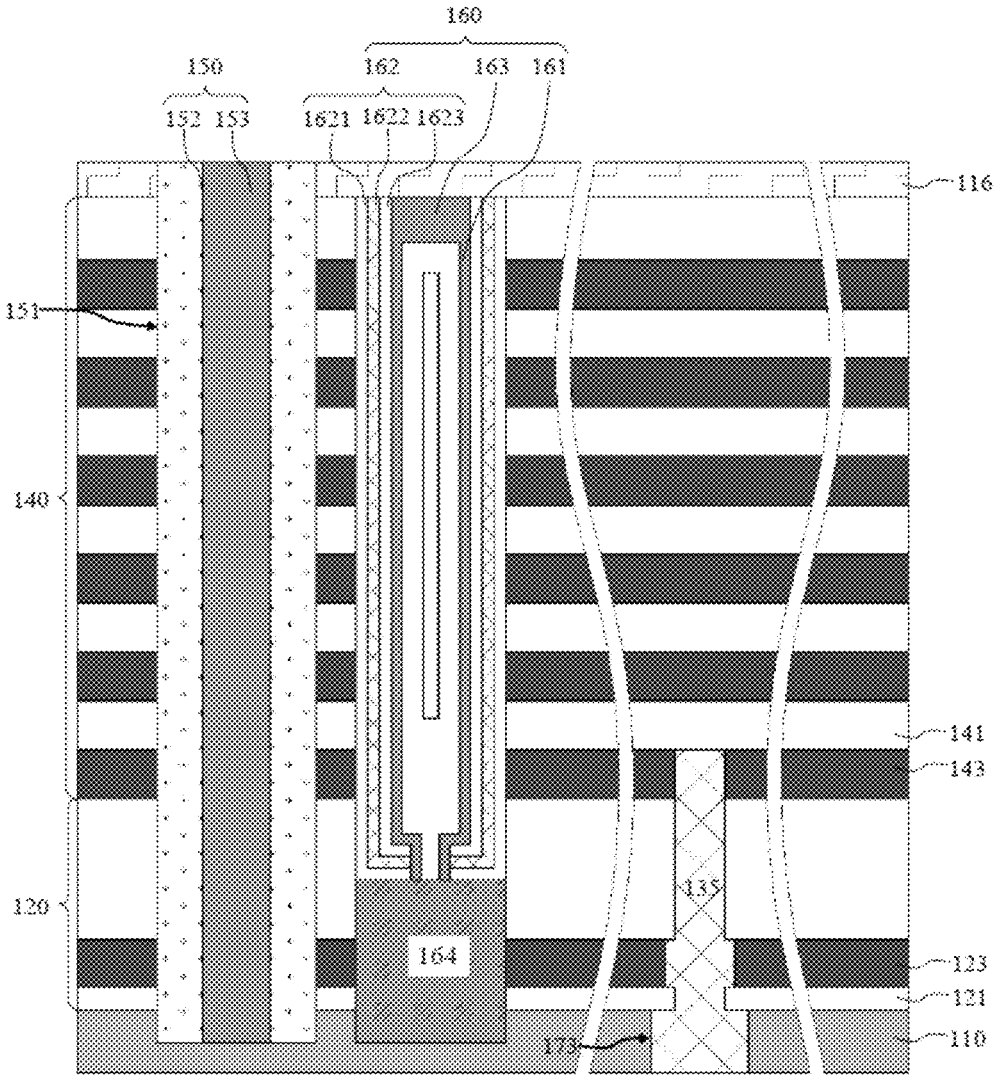

FIGS. 5A to 5B show a process method of electrically connecting channel layers 161 in the channel structures 160 with an active layer (for example, the substrate 110) of another implementation of the present disclosure. For the purpose of conciseness, the same methods as the steps described above and the resultant structures are not repeated here in the present disclosure.

In some implementations, as shown in FIG. 5A, the substrate 110 may comprise any suitable semiconductor material as described above. Exemplarily, the channel structures 160 may extend into the substrate 110 along a direction facing toward the substrate 110, for example, a direction perpendicular to the substrate 110. The channel structures 160 may comprise, for example, an epitaxial layer 164 close to the substrate 110. Optionally, the height of the epitaxial layer 164 from the substrate 110 may be greater than the height at which at least one first gate sacrificial layer 122 is located. The function layers 162 are located on the sidewalls of the channel holes and the surface of the epitaxial layer 164, and have notches at portions on the surface of the epitaxial layer 164. The channel layers 161 extend into the notches and contact with the epitaxial layer 164, so that the channel layers 161 are electrically connected with the substrate 110 through the epitaxial layer 164. Optionally, the gate slit 151 may, for example, extend into the substrate 110.

In some implementations of S160, as shown in FIG. 5B, the trench 173 through, for example, the substrate 110 may be formed from the side of the first stack structure 120 far away from the second stack structure 140 using photolithography and etching processes (for example, a wet or dry etching process). Exemplarily, the trench 173 may be used to replace the first conductive layers 133 with the third insulating layer 135 to form bottom select gate cut structures.

In some related arts, after forming the bottom select gate cuts, a dielectric material is generally filled within the bottom select gate cut structures to electrically isolate the gate sacrificial layers on two sides thereof (i.e., the gate conductive layers after subsequent replacement). The inventors find that in the case that the adjacent gate slits have two or more bottom select gate cuts therebetween (with reference to FIG. 3), during the process of replacing the gate sacrificial layers with the gate conductive layers via the gate slits, due to the blocking effect of the dielectric material filled within the bottom select gate cuts, it is difficult to replace the gate sacrificial layers between the two bottom select gate cuts with the gate conductive layers.

By first forming the first sacrificial layers within the bottom select gate cuts, and replacing the gate sacrificial layers between two bottom select gate cuts with the gate conductive layers via the gaps formed after removing the first sacrificial layers in the "gate replacement" process, the fabrication method of the three-dimensional memory provided according to some implementations of the present disclosure is beneficial to improve process compatibility, and feasibility in the case that there are a plurality of bottom select gate cuts between the adjacent gate slits.

The above description is merely some implementations of the present disclosure and an illustration of the applied technical principles. Those skilled in the art should understand that the scope of the present disclosure involved in the present disclosure is not limited to the technical solutions formed by specific combinations of the above technical features, and meanwhile, should also encompass other technical solutions formed by any combinations of the above technical features or equivalent features thereof without departing from the inventive concept, for example, technical solutions formed by mutual replacement of the above features with (but not limited to) the technical features with similar functions disclosed in the present disclosure.

What is claimed is:

1. A method of fabricating a three-dimensional memory, comprising:

forming a first stack structure on a substrate;

forming bottom select gate cuts through the first stack structure;

forming first sacrificial layers within the bottom select gate cuts;

forming a second stack structure covering the first sacrificial layers and the first stack structure, wherein both the first stack structure and the second stack structure comprise alternately stacked dielectric layers and gate sacrificial layers;

replacing the first sacrificial layers with first conductive layers, and the gate sacrificial layers with gate conductive layers;

forming trenches exposing the first conductive layers on a side of the first stack structure far away from the second stack structure; and replacing the first conductive layers with insulating layers via the trenches.

2. The method of claim 1, wherein replacing the first sacrificial layers with first conductive layers and replacing the gate sacrificial layers with gate conductive layers comprises:

forming gate slits through the second stack structure and the first stack structure; and replacing the first sacrificial layers with first conductive layers and replacing the gate sacrificial layers with gate conductive layers via the gate slits.

3. The method of claim 2, wherein the gate slits extend along a first direction parallel to the substrate; and at least two of the bottom select gate cuts extending along the first direction are located between adjacent ones of the gate slits.

4. The method of claim 3, wherein widths of the trenches are greater than those of the first conductive layers in a second direction that is parallel to the substrate and intersects with the first direction.

5. The method of claim 2, wherein replacing the first sacrificial layers with first conductive layers and replacing the gate sacrificial layers with gate conductive layers via the gate slits comprises:

removing the first sacrificial layers and the gate sacrificial layers via the gate slits to form sacrificial gaps;

forming the first conductive layers within portions of the sacrificial gaps corresponding to the first sacrificial layers; and forming the gate conductive layers within portions of the sacrificial gaps corresponding to the gate sacrificial layers.

6. The method of claim 1, wherein materials of the gate sacrificial layers and the first sacrificial layers are the same.

7. The method of claim 1, wherein materials of the gate conductive layers and the first conductive layers are the same.

8. The method of claim 1, wherein the trenches are at least partially aligned with the first conductive layers.

9. The method of claim 1, further comprising:

forming channel structures through the second stack structure and the first stack structure, the channel structures comprising function layers and channel layers extending into the substrate.

10. The method of claim 9, further comprising: before forming trenches exposing the first conductive layers on a side of the first stack structure far away from the second stack structure, removing the substrate and portions of the function layers extending into the substrate to expose portions of the channel layers; and forming a semiconductor layer in contact with exposed portions of the channel layers, wherein the trenches run through portions of the semiconductor layer corresponding to the first conductive layers.

11. The method of claim 9, wherein forming channel structures through the second stack structure and the first stack structure comprises:

making portions of the channel layers of the channel structures extending into the substrate to be contacted with the substrate, the trenches running through portions of the substrate corresponding to the first conductive layers.

12. The method of claim 1, wherein replacing the first conductive layers with insulating layers via the trenches comprises:

filling an insulating material within the trenches while replacing the first conductive layers with the insulating layers.

13. The method of claim 1, wherein replacing the first conductive layers with insulating layers via the trenches comprises:

removing the first conductive layers via the trenches;

removing a portion of the gate conductive layers in contact with the first conductive layers to form filling gaps; and forming the insulating layers within the filling gaps.

14. The method of claim 13, further comprising:

after removing a portion of the gate conductive layers in contact with the first conductive layers to form filling gaps, removing a portion of the conductive layers exposed to the filling gaps.

* * * * *